(12) United States Patent
Kwak

(10) Patent No.: US 8,917,556 B2
(45) Date of Patent: Dec. 23, 2014

(54) NONVOLATILE MEMORY DEVICE HAVING 3D MEMORY CELL ARRAY AND READ METHOD

(71) Applicant: Donghun Kwak, Suwon-Si (KR)

(72) Inventor: Donghun Kwak, Suwon-Si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 98 days.

(21) Appl. No.: 13/681,456

(22) Filed: Nov. 20, 2012

(65) Prior Publication Data

US 2013/0235673 A1 Sep. 12, 2013

(30) Foreign Application Priority Data

Mar. 12, 2012 (KR) ........................ 10-2012-0025159

(51) Int. Cl.
| | |
|---|---|
| G11C 11/06 | (2006.01) |
| H01L 27/115 | (2006.01) |
| G11C 16/26 | (2006.01) |
| G11C 16/06 | (2006.01) |
| G11C 16/20 | (2006.01) |
| G11C 16/04 | (2006.01) |

(52) U.S. Cl.
CPC ............ *G11C 16/06* (2013.01); *H01L 27/1157* (2013.01); *H01L 27/11524* (2013.01); *G11C 16/0441* (2013.01); *G11C 16/26* (2013.01); *G11C 16/0483* (2013.01); *G11C 16/20* (2013.01); *H01L 27/1158* (2013.01)
USPC ..................................................... 365/185.18

(58) Field of Classification Search
CPC ........ G11C 16/06; G11C 16/10; G11C 16/12; G11C 16/30; G11C 16/0483
USPC ..................................................... 365/185.18
See application file for complete search history.

(56) References Cited

U.S. PATENT DOCUMENTS

| | | | |
|---|---|---|---|
| 6,683,372 B1 | 1/2004 | Wong et al. | |
| 6,741,513 B2 | 5/2004 | Honigschmid et al. | |
| 7,796,432 B2 | 9/2010 | Kim et al. | |
| 7,826,269 B2 | 11/2010 | Kang | |
| 7,830,706 B2 | 11/2010 | Hanzaw et al. | |
| 7,983,084 B2 * | 7/2011 | Tokiwa et al. | ........... 365/185.11 |
| 8,094,489 B2 | 1/2012 | Hanzawa et al. | |
| 8,120,990 B2 * | 2/2012 | Kim | ........................ 365/238.5 |
| 2011/0235415 A1 * | 9/2011 | Park et al. | ................ 365/185.09 |
| 2011/0317489 A1 * | 12/2011 | Kim et al. | ................ 365/185.18 |
| 2012/0075926 A1 | 3/2012 | Hanzawa et al. | |

FOREIGN PATENT DOCUMENTS

JP 2009-158020 A 7/2009

* cited by examiner

*Primary Examiner* — Hoai V Ho
*Assistant Examiner* — Tri Hoang
(74) *Attorney, Agent, or Firm* — Volentine & Whitt, PLLC

(57) ABSTRACT

Disclosed is a method reading memory device information from a nonvolatile memory device having a three-dimensional (3D) memory cell array including an original plane storing data associated with the information in a first group of memory cells and a replica plane storing the data in replica in a second group of memory cells. The method applies a selection read voltage to a selected word line connected to first and second groups of memory cells while applying a non-selection read voltage to other word lines, and simultaneously reading first data from the first group of memory cells and second data from the second group of memory cells.

20 Claims, 21 Drawing Sheets

Fig. 11

|  | Stored Data | | | |
|---|---|---|---|---|
| 1st plane (Original Plane) | 1 | 0 | 0 | 1 |
| 3rd plane (Replica Plane) | 1 | 0 | 0 | 1 |

|  | Not Open Status | | | |
|---|---|---|---|---|
| 1st plane (Original Plane) | X | X | X | X |
| 3rd plane (Replica Plane) | 0 | 0 | X | X |

|  | Read data from each plane | | | |
|---|---|---|---|---|
| 1st plane (Original Plane) | 1 | 0 | 0 | 1 |
| 3rd plane (Replica Plane) | 0 | 0 | 0 | 1 |

|  | Totally read Data | | | |
|---|---|---|---|---|
| Read & Write Circuit | 1 | 0 | 0 | 1 |

NONVOLATILE MEMORY DEVICE HAVING 3D MEMORY CELL ARRAY AND READ METHOD

CROSS-REFERENCE TO RELATED APPLICATIONS

A claim for priority under 35 U.S.C. §119 is made to Korean Patent Application No. 10-2012-0025159 filed Mar. 12, 2012, the subject matter of which is hereby incorporated by reference.

BACKGROUND

The inventive concept relates to semiconductor memories, and more particularly, nonvolatile memory devices and read methods for nonvolatile memory devices.

Semiconductor memory devices may be classified as volatile or nonvolatile. A volatile memory device loses stored data in the absence of applied power. Examples of volatile memory devices include the static RAM (SRAM), dynamic RAM (DRAM), and synchronous DRAM (SDRAM).

In contrast, nonvolatile memory devices are able to retain stored data in the absence of applied power. Example of nonvolatile memory devices include the read only memory (ROM), programmable ROM (PROM), electrically programmable ROM (EPROM), electrically erasable and programmable ROM (EEPROM), flash memory device (including NOR type and NAND type), phase-change RAM (PRAM), magnetic RAM (MRAM), resistive RAM (RRAM), and ferroelectric RAM (FRAM).

SUMMARY

Embodiments of the inventive concept provide a method reading memory device information from a nonvolatile memory device having a three-dimensional (3D) memory cell array including an original plane storing data associated with the information in a first group of memory cells and a replica plane storing the data in replica in a second group of memory cells, the method comprising; applying a selection read voltage to a selected word line connected to the first and second groups of memory cells while applying a non-selection read voltage to other word lines, and simultaneously reading first data from the first group of memory cells and second data from the second group of memory cells.

Embodiments of the inventive concept provide a nonvolatile memory device comprising; a memory cell array including a plurality of memory cells, an address decoder connected to the plurality of memory cells via a plurality of word lines, a read/write circuit connected to the plurality of memory cells via a plurality of bit lines, and control logic configured to control the address decoder and the read/write circuit, wherein during an information read operation, the address decoder is configured to simultaneously select at least two word lines, and the read/write circuit is configured to simultaneously read memory cells connected to the selected at least two word lines.

Embodiments of the inventive concept provide a control method for a system including a controller and a nonvolatile memory (NVM), the NVM including a three-dimensional (3D) memory cell array, and the method comprising; storing memory device information data in a first group of memory cells in an original plane of the 3D memory cell array, storing a replica of the memory device information data in a second group of memory cells in a replica plane of the 3D memory cell array, different from the original plane, and configuring the controller to execute a memory device information read operation during which the first and second groups of memory cells are simultaneously read from the 3D memory cell array.

BRIEF DESCRIPTION OF THE FIGURES

Certain embodiments of the inventive concept are described hereafter with reference to the accompanying drawings.

FIG. 11 is tables illustrating an information read result of a memory block in FIG. 10 according to an embodiment of the inventive concept.

DETAILED DESCRIPTION

Figure 1:
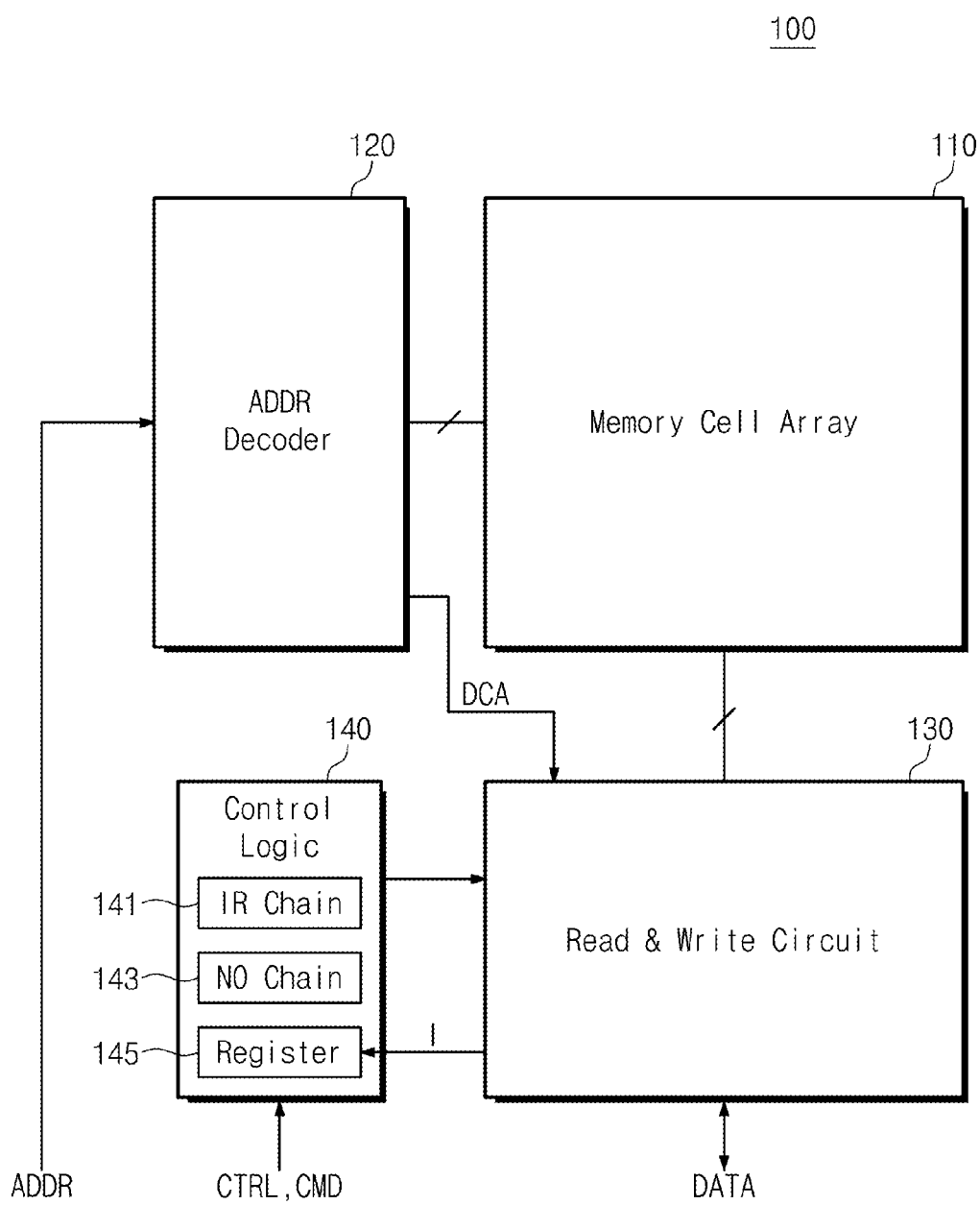
FIG. 1 is a block diagram illustrating a nonvolatile memory device according to an embodiment of the inventive concept.

Embodiments of the inventive concept will now be described in some additional detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numbers and labels denote like or similar elements throughout the drawings and written description. In the drawings, the size(s) and relative size(s) of certain layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term "selected bit line" or "selected bit lines" may be used to indicate a bit line or bit lines, connected with a cell transistor to be programmed or read, from among a plurality of bit lines. The term "unselected bit line" or "unselected bit lines" may be used to indicate a bit line or bit lines, connected with a cell transistor to be program-inhibited or read-inhibited, from among a plurality of bit lines.

The term "selected string selection line" may be used to indicate a string selection line, connected with a cell string including a cell transistor to be programmed or read, from among a plurality of string selection lines. The term "unselected string selection line" or "unselected string selection lines" may be used to indicate a remaining string selection line or remaining string selection lines other than the selected string selection line from among a plurality of string selection lines. The term "selected string selection transistors" may be used to indicate string selection transistors connected with a selected string selection line. The term "unselected string selection transistors" may be used to indicate string selection transistors connected with an unselected string selection line or unselected string selection lines.

The term "selected ground selection line" may be used to indicate a ground selection line, connected with a cell string including a cell transistor to be programmed or read, among a plurality of ground selection lines. The term "unselected ground selection line" may be used to indicate a remaining ground selection line or remaining ground selection lines other than the selected ground selection line from among a plurality of ground selection lines. The term "selected ground selection transistors" may be used to indicate ground selection transistors connected with a selected ground selection line. The term "unselected ground selection transistors" may be used to indicate ground selection transistors connected with an unselected ground selection line or unselected ground selection lines.

The term "selected word line" may be used to indicate a word line, connected with a cell transistor to be programmed or read, from among a plurality of word lines. The term "unselected word line" or "unselected word lines" may be used to indicate a remaining word lines or remaining word lines other than a selected word line from among a plurality of word lines.

The term "selected memory cell" or "selected memory cells" may be used to designate memory cells to be programmed or read among a plurality of memory cells. The term "unselected memory cell" or "unselected memory cells" may be used to indicate a remaining memory cell or remaining memory cells other than a selected memory cell or selected memory cells from among a plurality of memory cells.

Embodiments of the inventive concept will be described in the context of certain NAND flash memory examples. However, the inventive concept is not limited thereto. The inventive concept may be applied to nonvolatile memory devices such as an Electrically Erasable and Programmable ROM (EEPROM), a NOR flash memory, a Phase-change RAM (PRAM), a Magnetic RAM (MRAM), a Resistive RAM (RRAM), a Ferroelectric RAM (FRAM), and the like.

Figure (FIG. 1 is a block diagram illustrating a nonvolatile memory device according to an embodiment of the inventive concept. Referring to FIG. 1, a nonvolatile memory device 100 comprises a memory cell array 110, an address decoder 120, a read/write circuit 130, and control logic 140.

The memory cell array 110 may be connected to the address decoder 120 via word lines and to the read/write circuit 130 via bit lines. The memory cell array 110 may include a plurality of memory cells. In certain embodiments of the inventive concept, memory cells arranged in a row direction may be connected to word lines WL, and memory cells arranged in a column direction may be connected to bit lines BL. For example, memory cells arranged in a column direction may form a plurality of cell groups (e.g., strings) that are connected to the bit lines, respectively.

The address decoder 120 may be connected to the memory cell array 110 via the word lines WL. The address decoder 120 may operate responsive to the control of the control logic 150.

The address decoder 120 may decode a row address of an input address ADDR, and may select the word lines WL in response to the decoded row address. The address decoder 120 may decode a column address of the input address ADDR to transfer it to the read/write circuit 130. In certain embodiments, the address decoder 120 may include constituent element such as a row decoder, a column decoder, an address buffer, and the like.

The read/write circuit 130 may be coupled with the memory cell array 110 via bit lines BL. The read/write circuit 130 may be configured to exchange data with an external device. The read/write circuit 130 may operate responsive to the control of the control logic 140. The read/write circuit 130 may select bit lines BL in response to the decoded column address DCA provided from the address decoder 120.

The read/write circuit 130 may receive data from an external device to write it in the memory cell array 110. The read/write circuit 130 may read data from the memory cell array 110 to output it to the external device. The read/write circuit 130 may read data from the first storage area of the memory cell array 110 to write it in the second storage area thereof. That is, the read/write circuit 130 may perform a copy-back operation.

In certain embodiments, the read/write circuit 130 may include constituent elements such as a page buffer (or, a page register), a column selecting circuit, a data buffer, and the like. In other embodiments, the read/write circuit 130 may include constituent elements such as a sense amplifier, a write driver, a column selecting circuit, a data buffer, and the like.

The control logic 140 may be coupled with the address decoder 120 and the read/write circuit 130. The control logic 140 may be configured to control an overall operation of the nonvolatile memory device 100. The control logic 140 may operate responsive to a control signal CTRL and a command CMD provided from an external device.

The control logic 140 may include an information read (IR) chain 141, a normal operation (NO) chain 142, and a register 145.

The IR chain 141 may be configured to execute a so-called "information read operation" of the nonvolatile memory device 100. The IR chain 141 may control the address decoder 120 and the read/write circuit 130 to perform the information read operation. In certain embodiments, an information read operation may be performed when a power is initially supplied to the nonvolatile memory device 100. The "information" read (generically indicated in FIG. 1 as "I") during an information read operation may include initial setting values for the nonvolatile memory device 100, such as information defining certain voltage levels to be used during "normal operations" (e.g., read, program and/or erase operations) performed by the nonvolatile memory device 100.

Alternately or additionally, an information read operation may be performed during the operation of the nonvolatile memory device 100, and the information read may include so-called "high reliability data" (e.g., metadata) critical to the proper operation of the nonvolatile memory device 100, as compared with bulk file data, or user-defined payload data.

In certain embodiments, information indicating initial setting values may be stored at a specific memory block of the memory cell array 110. However, the IR chain 141 may control the address decoder 120 and the read/write circuit 130 to read designated (or selected) memory cells in any memory block storing the information.

The NO chain 143 controls all of the normal operations.

The register 145 may be used to store information returned from the read/write circuit 130 to control logic 140 as the result of an information read operation, and the control logic 140 may then control the nonvolatile memory device 100 in response to the information stored in the register 145.

Alternately or additionally, when the information returned by an information read operation is high reliability data such as metadata, it may be output to an external device, rather than being stored in the register 145 of the control logic 140.

Figure 2:
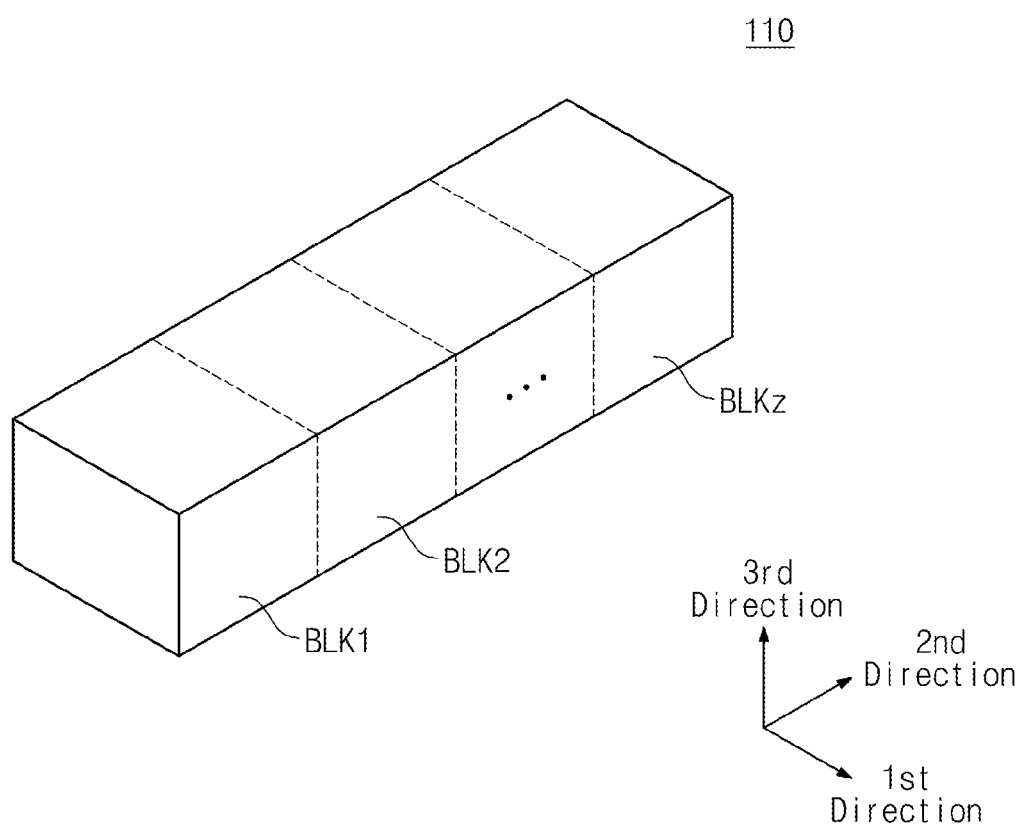
FIG. 2 is a diagram illustrating a memory cell array in FIG. 1 according to an embodiment of the inventive concept.

FIG. 2 is a diagram further illustrating in one example the memory cell array 110 of FIG. 1. Referring to FIGS. 1 and 2, the memory cell array 110 may include a plurality of memory blocks BLK1 to BLKz. In certain embodiments of the inventive concept, the memory cell array 110 and its constituent plurality of memory blocks BLK1 to BLKz may be implemented using a three-dimensional (3D) (or "vertical") structure. For example, each of the memory blocks BLK1 to BLKz may include structures extending along first to third directions. Although not shown in FIG. 2, each of the memory blocks BLK1 to BLKz may include a plurality of cell strings extending along the second direction, and being spaced apart in the first and third directions.

As will be appreciated from the descriptions that follow, cell strings within a memory block may be coupled to a plurality of bit lines BL, a plurality of string selection lines SSL, a plurality of word lines WL, one or more ground selection lines GSL, and a common source line. Cell strings in the plurality of memory blocks BLK1 to BLKz may share a plurality of bit lines. For example, the plurality of bit lines may extend along the second direction so as to be shared by the plurality of memory blocks BLK1 to BLKz.

The plurality of memory blocks BLK1 to BLKz may be selected by an address decoder 120 in FIG. 1. For example, the address decoder 120 may be configured to select a memory block, corresponding to an input address ADDR, from among the plurality of memory blocks BLK1 to BLKz. Erasing, programming, and reading of a selected memory block may be performed in accordance with the foregoing structural features, as will be appreciated by those skilled in the art. Certain examples of the memory blocks BLK1 to BLKz will be more fully described with reference to FIGS. 3 to 6 hereafter.

Figure 3:
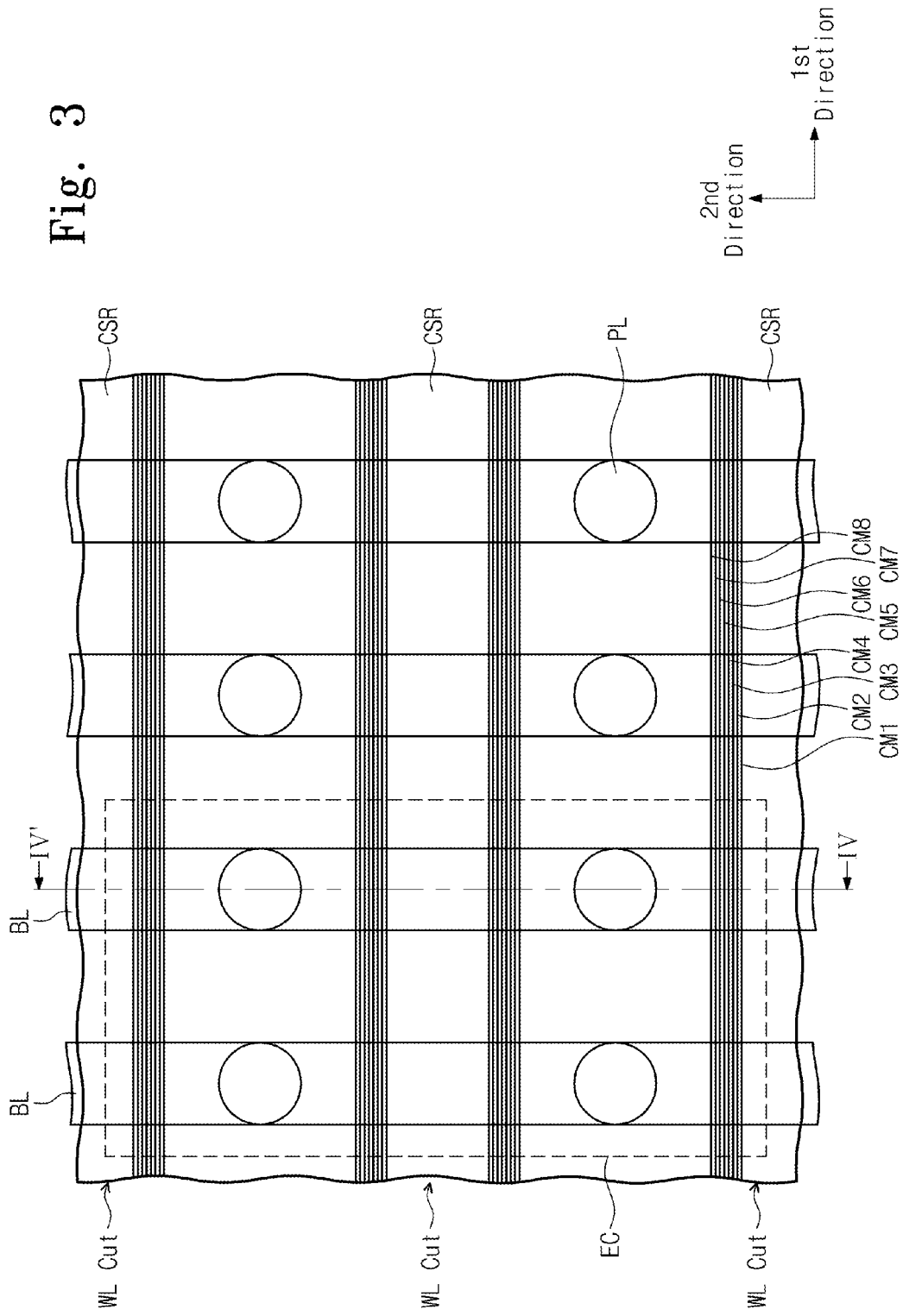
FIG. 3 is a top view of a part of one memory block in FIG. 1 according to an embodiment of the inventive concept.
Figure 4:
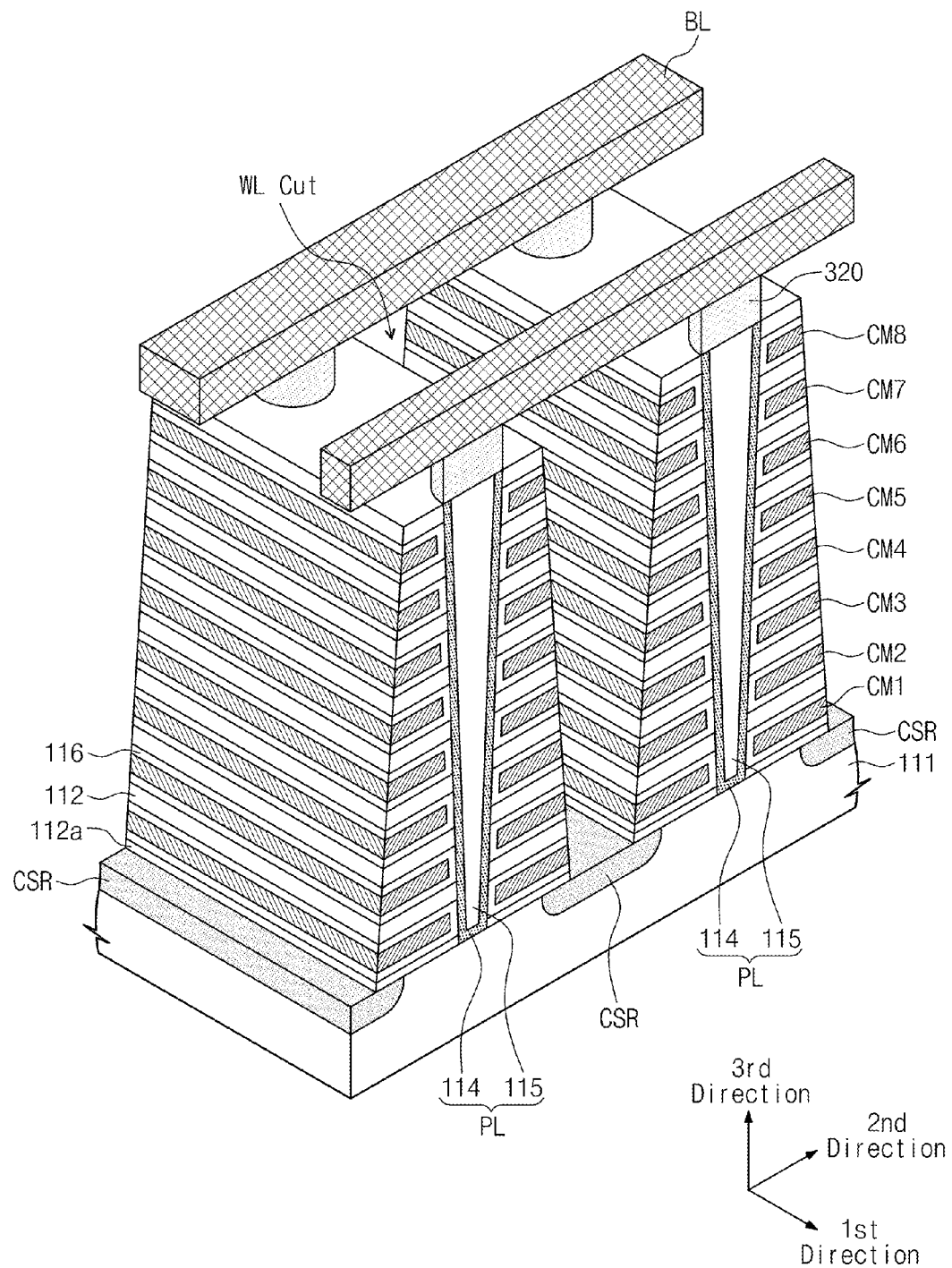
FIG. 4 is a perspective view taken along a line IV-IV' in FIG. 3 according to an embodiment of the inventive concept.
Figure 5:
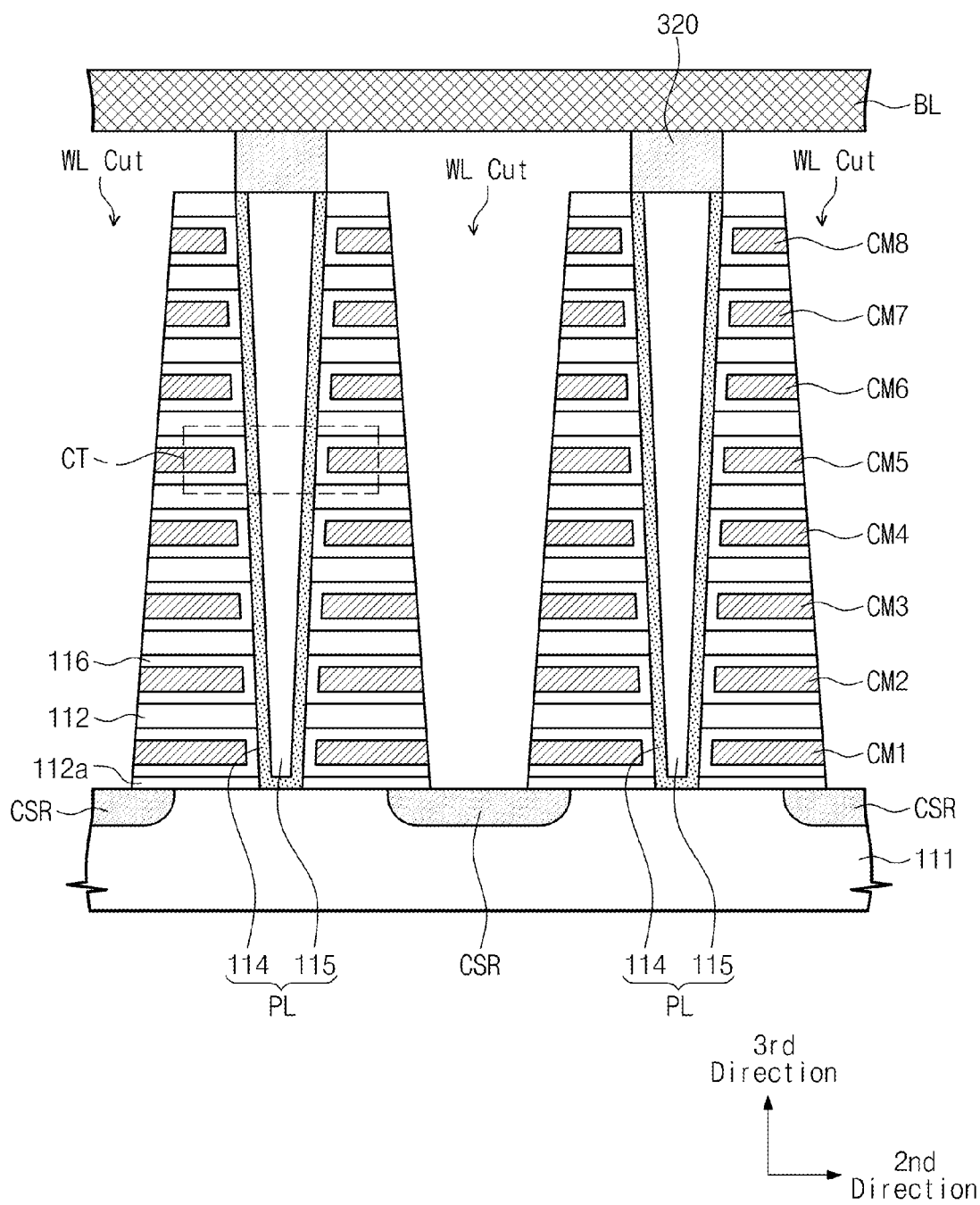
FIG. 5 is a cross-sectional view taken along a line IV-IV' in FIG. 3 according to an embodiment of the inventive concept.
Figure 6:
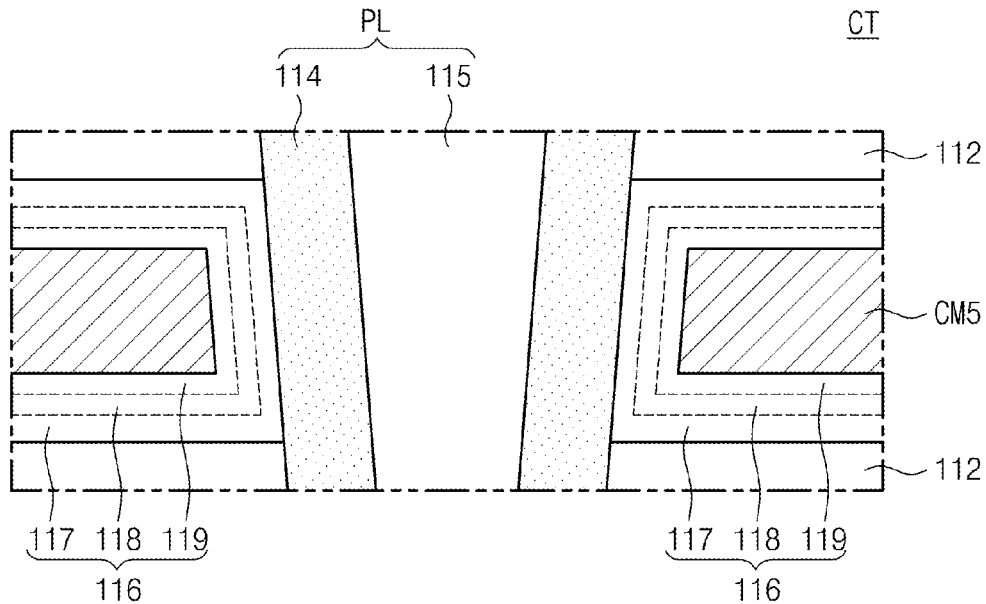
FIG. 6 is an enlarged diagram illustrating one of cell transistors in FIG. 5.

FIG. 3 is a top view further illustrating in an exemplary portion one memory block of FIG. 2. FIG. 4 is a related perspective view taken along line IV-IV' of FIG. 3, FIG. 5 is a related cross-sectional view taken along line IV-IV' of FIG. 3, and FIG. 6 is an enlarged diagram still further illustrating one cell transistor of FIG. 5.

Referring collectively to FIGS. 3-6, exemplary 3D structures for the memory cell array 110 extending along first to third directions are presented.

The substrate 111 may be a well having a first conductivity type, for example. The substrate 111 may be a p-well in which the Group III element such as boron is injected. The substrate 111 may be a pocket p-well which is provided within an n-well. Below, it is assumed that the substrate 111 is a p-well (or, a pocket p-well). However, the substrate 111 is not limited to p-type.

A plurality of common source regions CSR extending along the first direction may be provided in the substrate 111. The common source regions CSR may be spaced apart from one another along the second direction. The common source regions CSR may be connected in common to form a common source line.

The common source regions CSR may have a second conductivity type different from that of the substrate 111. For example, the common source regions CSR may be n-type. Below, it is assumed that the common source regions CSR are n-type. However, the common source regions CSR are not limited to the n-type.

Between two adjacent regions of the common source regions CSR, a plurality of insulation materials 112 and 112a may be provided sequentially on the substrate 111 along the third direction (i.e., a direction perpendicular to the substrate 111). The insulation materials 112 and 112a may be spaced apart along the third direction. The insulation materials 112 and 112a may extend along the first direction. For example, the insulation materials 112 and 112a may include an insulation material such as a semiconductor oxide film. The insulation material 112a contacting with the substrate 111 may be thinner in thickness than other insulation materials 112.

Between two adjacent regions of the common source regions CSR, a plurality of pillars PL may be arranged sequentially along the first direction so as to penetrate the plurality of insulation materials 112 and 112a along the second direction. For example, the pillars PL may contact with the substrate 111 through the insulation materials 112 and 112a.

In embodiments, the pillars PL between two adjacent common source regions CSR may be spaced apart along the first direction. The pillars PL may be disposed in line along the first direction.

In embodiments, the pillars PL may be formed of a plurality of materials, respectively. Each of the pillars PL may include a channel film 114 and an inner material 115 provided within the channel film 114.

The channel films 114 may include a semiconductor material (e.g., silicon) having a first conductivity type. For example, the channel films 114 may include a semiconductor material (e.g., silicon) having the same type as the substrate 111. The channel films 114 can include intrinsic semiconductor being a nonconductor.

The inner materials 115 may include an insulation material. For example, the inner materials 115 may include an insulation material such as silicon oxide. Alternatively, the inner materials 115 may include air gap.

Between two adjacent regions of the common source regions CSR, information storage films 116 may be provided on exposed surfaces of the insulation materials 112 and 112a and the pillars PL. The information storage films 116 may store information by trapping or discharging charges.

Between two adjacent common source regions CSR and between the insulation materials 112 and 112a, conductive materials CM1 to CM8 may be provided on exposed surfaces of the information storage films 116. The conductive materials CM1 to CM8 may extend along the first direction. The conductive materials CM1 to CM8 on the common source regions CSR may be separated by word line cuts. The common source regions CSR may be exposed by the word line cuts. The word line cuts may extend along the first direction.

The conductive materials CM1 to CM8 may include a metallic conductive material. The conductive materials CM1 to CM8 may include a nonmetallic conductive material such as polysilicon.

The information storage films 116 provided on an upper surface of an insulation material placed at the uppermost layer from among the insulation materials 112 and 112a can be removed. The information storage films provided at sides opposite to the pillars PL from among sides of the insulation materials 112 and 112a can be removed.

A plurality of drains 320 may be provided on the plurality of pillars PL, respectively. The drains 320 may include a semiconductor material (e.g., silicon) having a second conductivity type, for example. The drains 320 may include an n-type semiconductor material (e.g., silicon). Below, it is assumed that the drains 320 include n-type silicon. However, the inventive concept is not limited thereto. The drains 320 can be extended to the upside of the channel films 114 of the pillars PL.

Bit lines BL extending in the second direction may be provided on the drains 320 so as to be spaced apart from one another along the first direction. The bit lines BL may be coupled with the drains 320. In embodiments, the drains 320 and the bit lines BL may be connected via contact plugs (not shown). The bit lines BL may include a metallic conductive material. Alternatively, the bit lines BL may include a nonmetallic conductive material such as polysilicon.

Below, the conductive materials CM1 to CM8 may have first height to the eighth height according to a distance from the substrate 111.

The plurality of pillars PL may form a plurality of cell strings together with the information storage films 116 and the plurality of conductive materials CM1 to CM8. Each of the pillars PL may form a cell string with information storage films 116 and adjacent conductive materials CM1 to CM8.

The pillars PL may be provided on the substrate 111 along row and column directions. The eighth conductive materials CM8 may constitute rows. Pillars connected with the same eighth conductive material CM8 may constitute one row. The bit lines BL may constitute columns. Pillars connected with the same bit line BL may constitute a column. The pillars PL may constitute a plurality of strings arranged along row and column directions together with the information storage films 116 and the plurality of conductive materials CM1 to CM8. Each cell string may include a plurality of cell transistors CT stacked in a direction perpendicular to the substrate 111.

The cell transistors CT may be formed of conductive materials CM1 to CM8, pillars PL, and information storage films 116 provided between the conductive materials CM1 to CM8 and the pillars PL.

The information storage films 116 may extend to upper surfaces and lower surfaces of the conductive materials CM1 to CM8 from regions between the conductive materials CM1 to CM8 and the pillars PL. Each of the information storage films 116 may include first to third sub insulation films 117, 118, and 119.

In the cell transistors CT, the channel films 114 of the pillars PL may include the same p-type silicon as the substrate 111. The channel films 114 may act as bodies of cell transistors CT. The channel films 114 may be formed in a direction perpendicular to the substrate 111. The channel films 114 of the pillars PL may act as a vertical body. Vertical channels may be formed at the channel films 114.

The first sub insulation films 117 adjacent to the pillars PL may act as tunneling insulation films of the cell transistors CT. For example, the first sub insulation films 117 may include a thermal oxide film, respectively. The first sub insulation films 117 may include a silicon oxide film, respectively.

The second sub insulation films 118 may act as charge storage films of the cell transistors CT. For example, the second sub insulation films 118 may act as a charge trap film, respectively. For example, the second sub insulation films 118 may include a nitride film or a metal oxide film, respectively.

The third sub insulation films 119 adjacent to the conductive materials CM1 to CM8 may act as blocking insulation films of the cell transistors CT. In this embodiment, the third sub insulation films 119 may be formed of a single layer or multiple layers. The third sub insulation films 119 may be a high dielectric film (e.g., an aluminum oxide film, a hafnium oxide film, etc.) having a dielectric constant larger than those of the first and second sub insulation films 117 and 118. The third sub insulation films 119 may include a silicon oxide film, respectively.

The first to third sub insulation films 117 to 119 may constitute ONA (oxide-nitride-aluminum-oxide) or ONO (oxide-nitride-oxide).

The plurality of conductive materials CM1 to CM8 may act as a gate (or, a control gate), respectively.

That is, the plurality of conductive materials CM1 to CM8 acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute a plurality of cell transistors CT stacked in a direction perpendicular to the substrate 111. In certain embodiments, the cell transistors CT may be a charge trap type cell transistor.

The cell transistors CT can be used for different purposes according to height. For example, among the cell transistors CT, cell transistors having at least one height and placed at an upper portion may be used as string selection transistors. The string selection transistors may be configured to perform switching operations between cell strings and bit lines. Among the cell transistors CT, cell transistors having at least one height and placed at a lower portion may be used as ground selection transistors. The ground selection transistors may be configured to perform switching operations between cell strings and a common source line formed of common source regions CSR. Cell transistors between cell transistors used as string and ground selection transistors may be used as memory cells and dummy memory cells.

The conductive materials CM1 to CM8 may extend along the first direction to be connected with the plurality of pillars PL. The conductive materials CM1 to CM8 may constitute conductive lines interconnecting cell transistors CT of the pillars PL. In this embodiment, the conductive materials CM1 to CM8 may be used as a string selection line, a ground selection line, a word line, or a dummy word line according to the height.

Conductive lines interconnecting cell transistors used as string selection transistors may be used as string selection lines. Conductive lines interconnecting cell transistors used as ground selection transistors may be used as ground selection lines. Conductive lines interconnecting cell transistors used as memory cells may be used as word lines. Conductive lines interconnecting cell transistors used as dummy memory cells may be used as dummy word lines.

Figure 7:
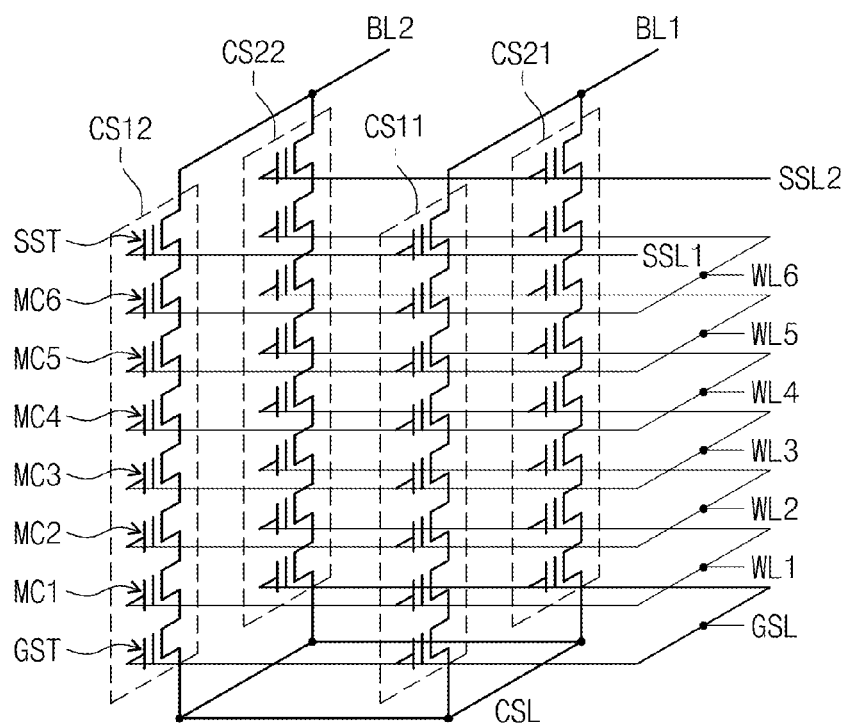
FIG. 7 is a circuit diagram illustrating an equivalent circuit of a part EC of a top view in FIG. 3 according to an embodiment of the inventive concept.

FIG. 7 is an equivalent circuit diagram for relevant portions of the 3D memory cell array described above in relation to FIGS. 3-6. Referring collectively to FIGS. 3-7, cell strings CS11, CS12, CS21, and CS22 may be provided between bit lines BL1 and BL2 and a common source line CSL. Cell strings CS11 and CS21 may be connected between the first bit line BL1 and the common source line CSL, and cell strings CS12 and CS22 may be connected between the second bit line BL2 and the common source line CSL.

Common source regions CSR may be connected in common to form a common source line CSL.

The cell strings CS11, CS12, CS21, and CS22 may correspond to four pillars of a partial EC shown in the top view of FIG. 3. The four pillars may constitute four cell strings CS11, CS12, CS21, and CS22 together with conductive materials CM1 to CM8 and information storage films 116.

In certain embodiments, the first conductive materials CM1 may constitute ground selection transistors GST with the information storage films 116 and the pillars PL. The first conductive materials CM 1 may form a ground selection line GSL. The first conductive materials CM1 may be interconnected to form a ground selection line GSL.

The second to seventh conductive materials CM2 to CM7 may constitute first to sixth memory cells MC1 to MC6 with the information storage films 116 and the pillars PL. The second to seventh conductive materials CM2 to CM7 may be used as second to sixth word lines WL2 to WL6.

The second conductive material CM2 may be interconnected to form the first word line WL1. The third conductive material CM3 may be interconnected to form the second word line WL2. The fourth conductive material CM4 may be interconnected to form the third word line WL3. The fifth conductive material CM5 may be interconnected to form the fourth word line WL4. The sixth conductive material CM6 may be interconnected to form the fifth word line WL5. The seventh conductive material CM7 may be interconnected to form the sixth word line WL6.

The eighth conductive materials CM8 may constitute string selection transistors SST with the information storage films 116 and the pillars PL. The eighth conductive materials CM8 may form string selection lines SSL1 and SSL2.

Memory cells of the same height may be connected in common with one word line. Accordingly, when a voltage is applied to a word line of a specific height, it may be applied to all cell strings CS11, CS12, CS21, and CS22.

Cell strings in different rows may be connected with different string selection lines SSL1 and SSL2, respectively. The cell strings CS11, CS12, CS21, and CS22 may be selected or unselected by the row by selecting or unselecting the string selection lines SSL1 and SSL2. For example, cell strings (CS11 and CS12) or (CS21 and CS22) connected with an unselected string selection line SSL1 or SSL2 may be electrically separated from the bit lines BL1 and BL2. Cell strings (CS21 and CS22) or (CS11 and CS12) connected with a selected string selection line SSL2 or SSL1 may be electrically connected with the bit lines BL1 and BL2.

The cell strings CS11, CS12, CS21, and CS22 may be connected with the bit lines BL1 and BL2 by the column. The cell strings CS11 and CS21 may be connected with the bit line BL1, and the cell strings CS12 and CS22 may be connected with the bit line BL2. The cell strings CS11, CS12, CS21, and CS22 may be selected and unselected by the column by selecting and unselecting the bit lines BL1 and BL2.

However, certain problems may arise during the formation of pillars PL. For example, holes at which the pillars PL are to be formed may not contact with the substrate 111 due to a process error. That is, holes at which the pillars PL are to be formed may not be formed deeply. In this case, the channel films 114 may not contact with the substrate 111. That is, cell strings CS may include strings that are not opened.

A problem may arise when the drains 320 are formed. For example, the drains 320 may not contact with the channel films 114 of the pillars PL due to a process error. In this case, the cell strings CS may include strings that are not opened.

If the cell strings CS include strings that are not opened, program, read, and/or erase operations directed to a memory block BLKa1. Further, information read operations may not be normally performed. To prevent "abnormal" information read operations, memory device information (e.g., initial setting values and/or metadata) is conventionally read using multiple read operations. Yet, this approach extends the time required by information read operation. However, embodiments of the inventive concept reduce the number of constituent read operations within an information read operation, and therefore improve operating speed of the nonvolatile memory device.

Figure 8:
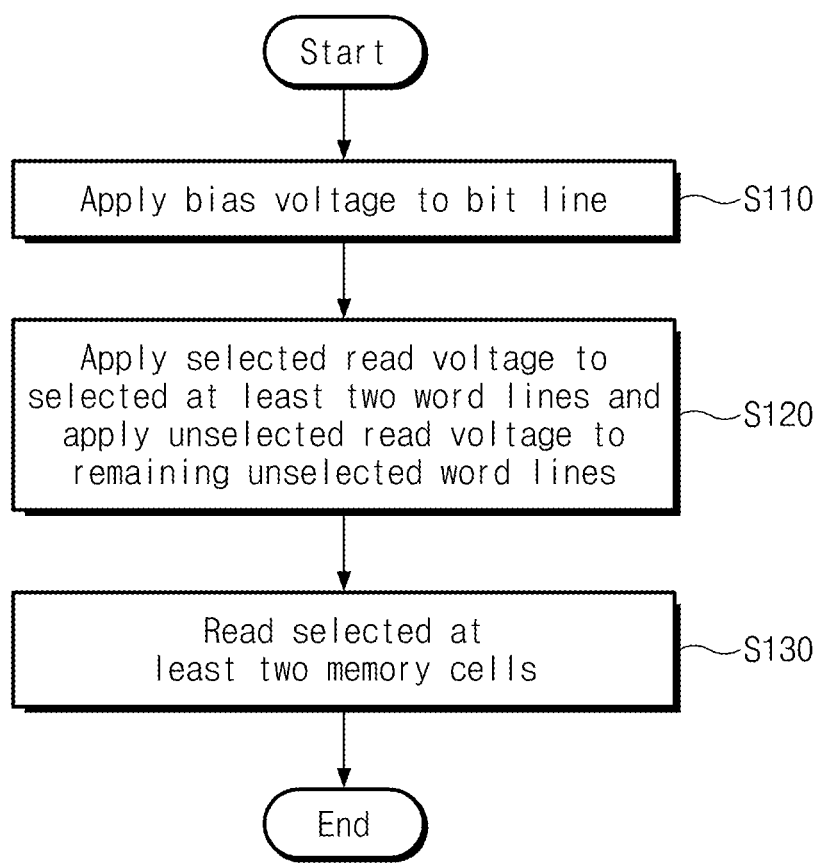
FIG. 8 is a flowchart illustrating an information read method according to an embodiment of the inventive concept.

FIG. 8 is a flowchart summarizing a method executing an information red operation according to an embodiment of the inventive concept. The method of FIG. 8 assumes that selected memory cells (to be read) are connected to a bit line of a memory block storing memory device information, such as initial setting values and/or metadata.

Referring to FIG. 8, a bias voltage is be applied to a bit line (S110). The bias voltage may be a power supply voltage, such as VCC.

A selection read voltage Vrd is applied to at least two (2) selected word lines, while a non-selection read voltage Vread is applied to remaining unselected word lines (S 120). The selection read voltage Vrd may be a voltage for judging the logical state of the selected memory cells. The non-selection read voltage Vread may be a high voltage that turns ON memory cells regardless of logical state.

Hence, at least two selected memory cells (respectively associated with and connected to the at least two selected word lines) are now simultaneously read (S 130).

Figure 9:
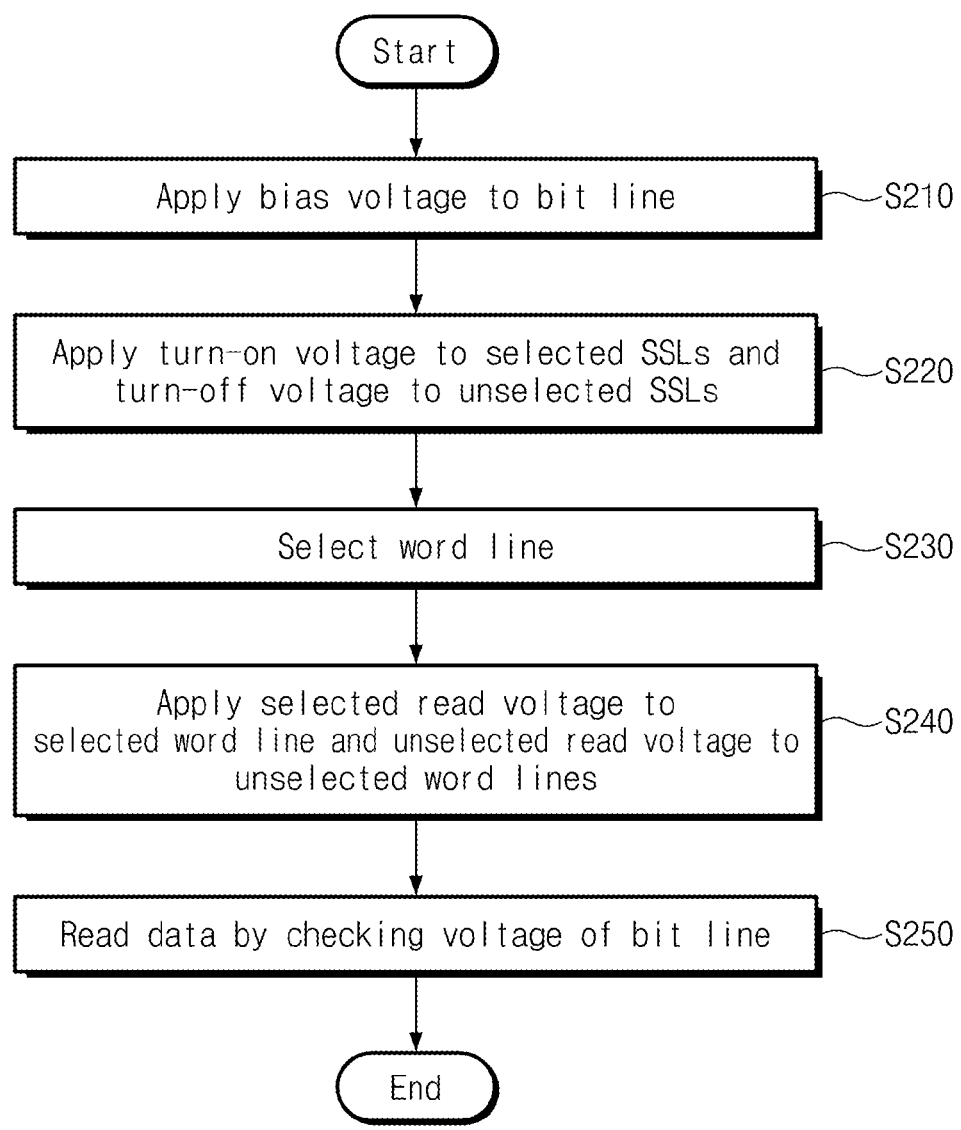
FIG. 9 is a flowchart illustrating an information read method for a vertical memory illustrated in FIGS. 3 to 7.

FIG. 9 is a flowchart further describing a method of executing an information read operation within a nonvolatile memory device including a 3D memory cell array, such as that described above in relation to FIGS. 3-7. Referring to FIGS. 3-9, a bias voltage may be applied to a bit lines BL1 or BL2 (S210). Step S210 corresponds to step S110 in FIG. 8.

A turn-on voltage is applied to at least two selected string selection lines SSL1 and SSL2, and a turn-off voltage is applied to the remaining unselected string selection lines (S220). Two string selection lines are illustrated in FIG. 7. However, as will be appreciated by one skilled in the art, memory block BLKa1 may include three or more string selection lines. Hence, the turn-on voltage may be applied to at least two string selection lines SSL1 and SSL2 of the plurality of string selection lines, and a turn-off voltage may be applied to the remaining unselected string selection lines.

Thus, step S220 may essentially select the selected memory cells to be read from among all of the memory cells connected to a bit line BL1 or BL2. Memory cells MC2 corresponding to the selected sting selection lines SSL1 and SSL2 supplied with the turn-on voltage may be electrically connected to the bit line BL1 or BL2.

Memory cells corresponding to the unselected sting selection lines supplied with the turn-off voltage will be electrically isolated from the bit line BL1 or BL2, and therefor will not be read.

A word line (e.g., WL2) is selected (S230). Since the memory cells MC2 placed at the same height above the substrate 111 are commonly connected to the word line WL2, two word lines placed at in a column direction (i.e., a bit line direction) may be selected when the word line WL2 is selected.

A selection read voltage Vrd is applied to the selected word line WL2, and a non-selection read voltage Vread is applied to unselected word lines WL1 and WL3 to WL6 (S240).

The steps S230 and S240 correspond with step S120 of FIG. 8.

Memory cells corresponding to the two selected string selection lines may be simultaneously read by checking voltage(s) apparent on the bit line BL1 or BL2 (S 150). Step S250 corresponds to step S130 of FIG. 8.

Figure 10:
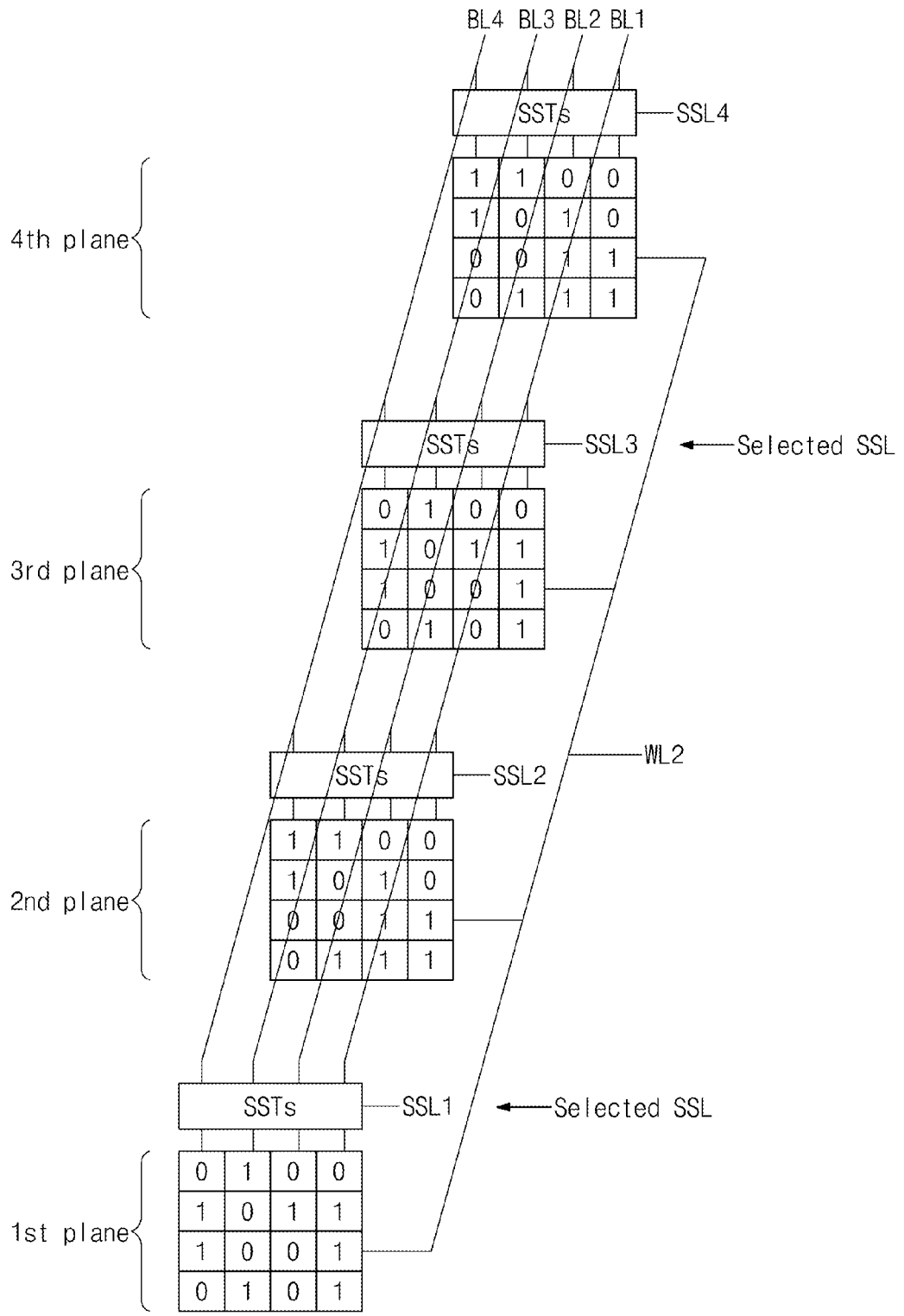
FIG. 10 is a diagram illustrating an example of data stored in planes of a memory block.

FIG. 10 is a conceptual diagram illustrating an example of data being stored across multiple planes of a memory block within a 3D memory cell array. In the illustrated example, each plane includes a grouping or sub-array of memory cells arranged as part of a collection of cell strings controlled by a corresponding string selection line.

For ease of description, only four planes respectively connected to four string selection lines SSL1 to SSL4 are illustrated in FIG. 10. The four planes are assumed to constitute memory block BLKa1 of FIG. 7, and accordingly, four word lines and four bit lines are illustrated in FIG. 10.

Referring to FIG. 10, first and second planes are assumed to store memory device information (e.g., initial setting values and/or metadata), while the third and fourth planes are assumed to respectively "replicate" the same data stored in the first and second planes. Hence, the third and fourth planes are called "replica planes" in relation to the first and second planes.

To improve the reliability of memory device information, said information may be stored in what will be referred to as "original planes" (i.e., the first and second planes) and corresponding replica planes (i.e., the third and fourth planes).

It is further assumed that the cell strings described in FIG. 10 include at least one cell string that are not opened, and that the memory cells in a "not-open cell string" are always judged to be programmed memory cells. In this regard, when memory cells of a not-open cell string are read, a read error will occur.

Consistent with certain embodiments of the inventive concept, original data and its corresponding replicate data associated with memory device information are simultaneously read from a pair of planes (a plane pair) (e.g., first and third planes, or second and fourth planes). Thus, if an original plane of the plane pair being read (e.g., the first plane or the second plane) includes a not-open cell string, but its replica plane of the plane pair (e.g., the third plane or the fourth plane) does not includes a not-open cell string, valid data for the memory device information may nonetheless be retrieved during the information read operation.

FIG. 11 includes a set of tables that further illustrate the information read operation result for the memory block of FIG. 10. It is assumed that data stored at memory cells of the first and third planes connected to a second word line WL2 are illustrated in a first table of FIG. 11. That is, with reference to FIGS. 10 and 11, memory cells of the first (original) plane store data bits '1001', and memory cells in the third (replica) plane are intended to similarly store data bits '1001'.

The presence of not-open cell strings is further illustrated in a second table of FIG. 11. That is, it is assumed that cell strings in the first plane are normal cell strings, but the cell strings in the second plane connected to bit lines BL4 and BL3 are not-open cell strings while the cell strings connected to bit lines BL2 and BL1 are normal (open) cell strings.

Referring to a third table in FIGS. 10 and 11, the read results for the memory cells of the first and third planes are illustrated. Since the first plane is formed of normal cell strings, a read result is properly '1001'. However, since the cell strings in the third plane connected to the bit lines BL4 and BL3 are not-open, the stored contents of the memory cells are judged to be programmed memory cell(s). Thus, the read result for the memory cells of the third plane is improperly '0001'.

Referring to a fourth table in FIG. 11, the respective read results for the first and third planes are illustrated. A cell string in the third plane connected to the bit line BL4 may be a cell string not opened. A cell string in the first plane connected to the bit line BL4 may be a normal cell string, and may store '1'. A memory cell in the first plane connected to the bit line BL4 may be turned ON by a selection read voltage Vrd, and a bias voltage supplied to the bit line BL4 may be discharged via a cell string in the first plane. Thus, a result of simultaneously reading cell strings of the first and third planes connected to the fourth bit line BL4 will be a '1'.

A cell string in the third plane connected to the bit line BL3 may be a not-open cell string. A cell string in the first plane connected to the bit line BL3 may be a normal cell string, and may store '0'. A memory cell in the first plane connected to the bit line BL2 may be turned off by the selection read voltage Vrd, and a bias voltage supplied to the bit line BL3 may be discharged via a cell string in the first or third plane. Thus, a result of simultaneously reading cell strings of the first and third planes connected to the bit line BL3 will be a '0'.

As illustrated in FIG. 11, if a plane pair including original and replica planes are used to store memory device information (e.g., initial setting values and/or metadata) and are simultaneously read, the information read operation will return correct data even if one or more not-open cell string(s) are present. In this manner, memory device information may be reliably obtained with a reduced number of read operations, thereby improving operating speed.

In contrast, conventional read methods sequentially read data from original planes, and then replica planes are sequentially read to detect error(s) due to not-open cell string(s). That is, conventionally, target memory cells are iteratively read using a predetermined number of read operations in order to improve the reliability of the memory device information. However, embodiments of the inventive concept, simultaneously read original and replica planes, thereby improving the speed with which memory device information is obtained.

To further improve the reliability of memory device information (e.g., initial setting values and/or metadata), a plurality of bits may form a pattern, and the pattern may indicate a symbol. The symbol may be a unit forming initial setting values or metadata. In this case, the capacity of the memory device information may increase by the number of bits used to construct one pattern. That is, within embodiments of the inventive concept, since original and replica planes are simultaneously read, information read speed may be further improved when a plurality of bits are used to form a symbol.

Figure 12:
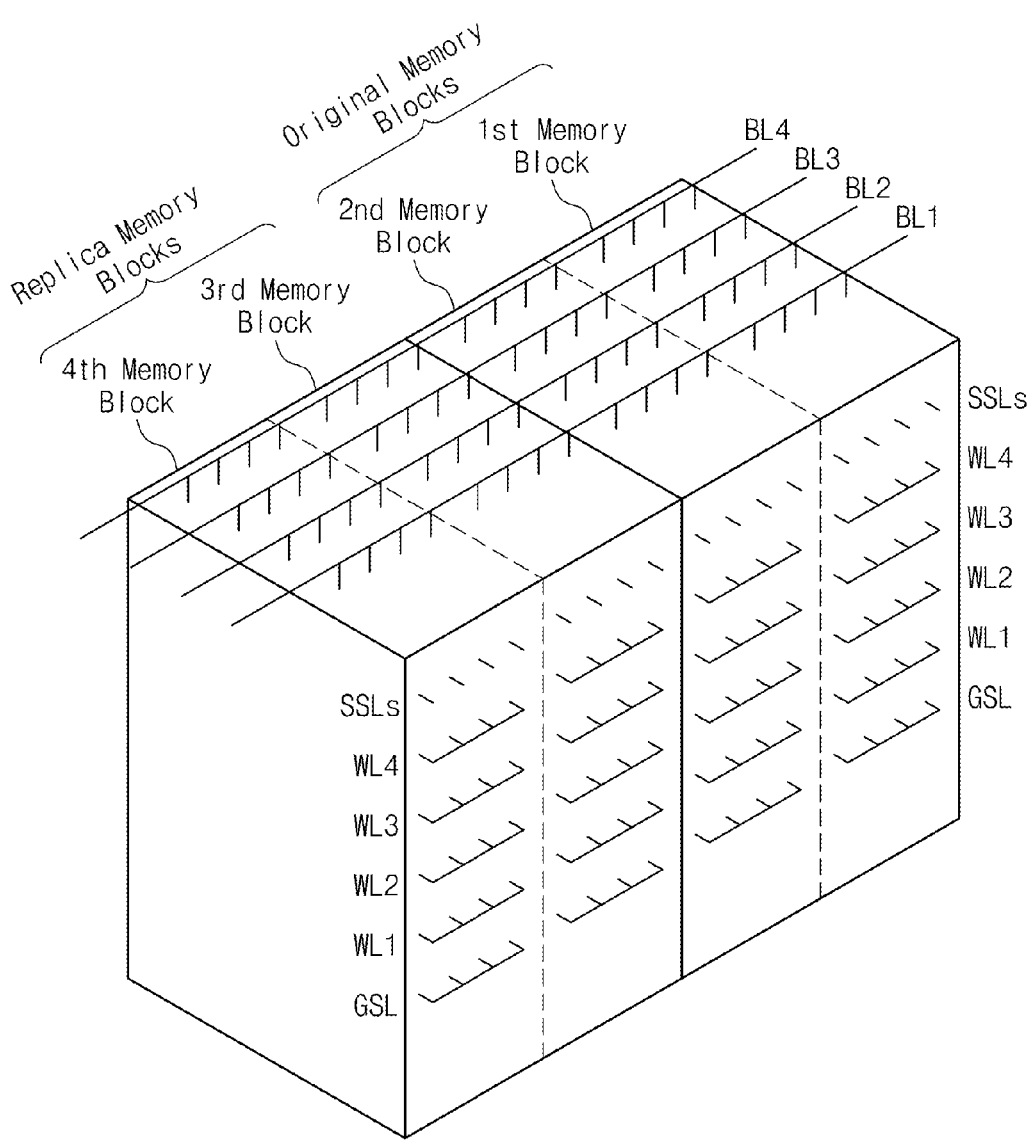
FIG. 12 is a diagram illustrating an example that information including initial setting values or metadata is stored at a plurality of memory blocks.

FIG. 12 is a conceptual diagram further illustrating an example wherein memory device information is stored at a plurality of memory blocks. Referring to FIG. 12, original memory blocks may include a first memory block and a second memory block. Each of the first and second memory blocks may include a plurality of planes (e.g., four planes). Planes of the first memory block may be original planes storing information including initial setting values or metadata. Planes of the second memory block may be replica planes of the planes of the first memory block as described with reference to FIG. 10.

The replica memory blocks may store the same data as the original memory blocks. Planes of the third memory block may store the same data as planes of the first memory block, and planes of the fourth memory block may store the same data as planes of the second memory block. That is, planes of the first to third memory blocks may store the same data as planes of the first memory block being original planes.

Consistent with the foregoing, the planes of the first to fourth memory blocks may be read together. One of planes of the first memory block may be selected. Further, a plane, storing the same data as the selected plane, from among planes of the second memory block, a plane, storing the same data as the selected plane, from among planes of the third memory block, and a plane, storing the same data as the selected plane, from among planes of the fourth memory block may be selected. The selected planes may be read together. In certain embodiments, since an original plane and a replica plane of original memory blocks and planes of replica memory blocks are read together, an information read speed may be improved up to four times.

Figure 13:
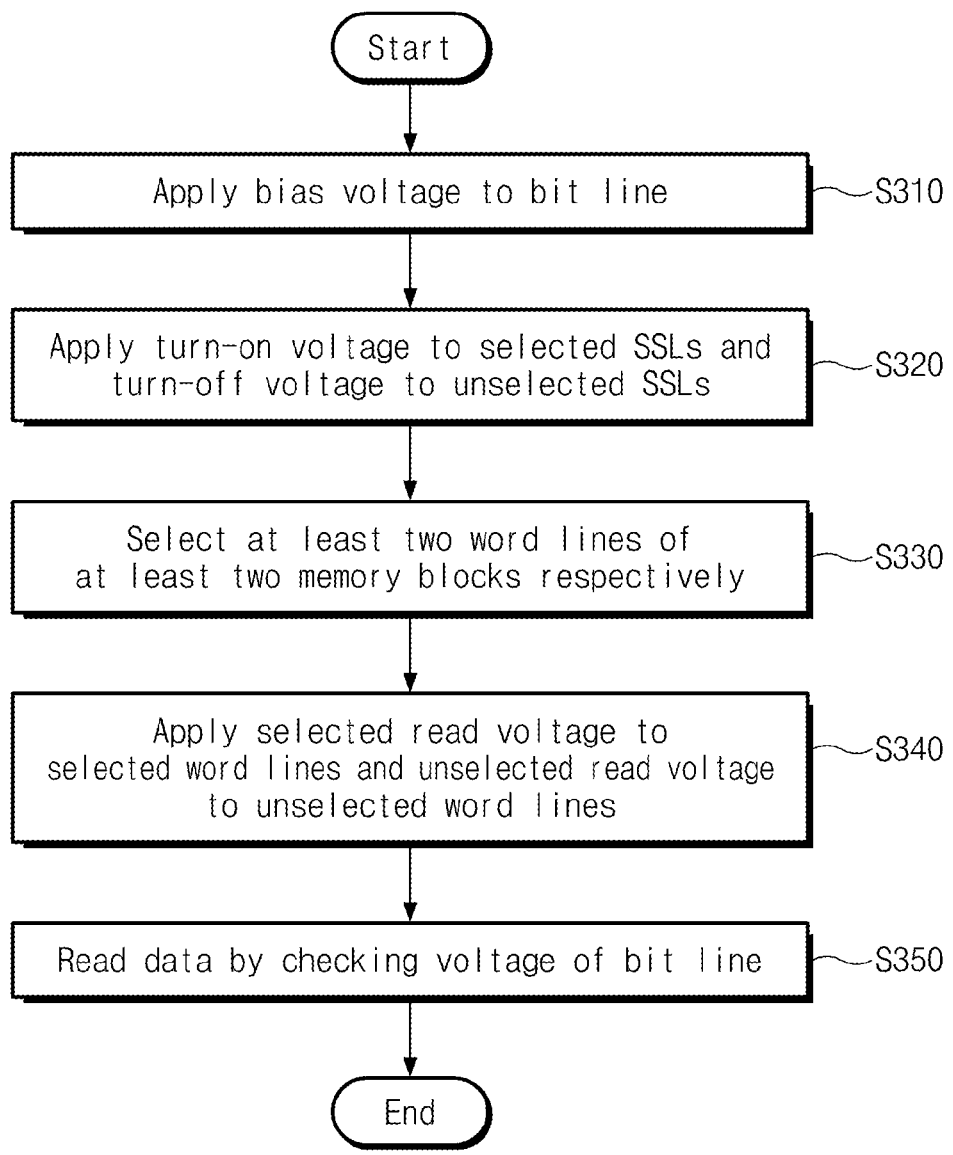
FIG. 13 is a flowchart illustrating an information read method performed at memory blocks in FIG. 12.

FIG. 13 is a flowchart summarizing a method executing an information read operation in relation to the memory blocks of FIG. 12. In FIG. 13, an information read method may be performed in the same manner as described with reference to FIG. 9, except at least two word lines are selected in step (S330), respectively. Thus, steps (S310), (S320), (S340), and (S350) correspond the steps (S210), (S220), (S240), and (S250).

Figure 14:
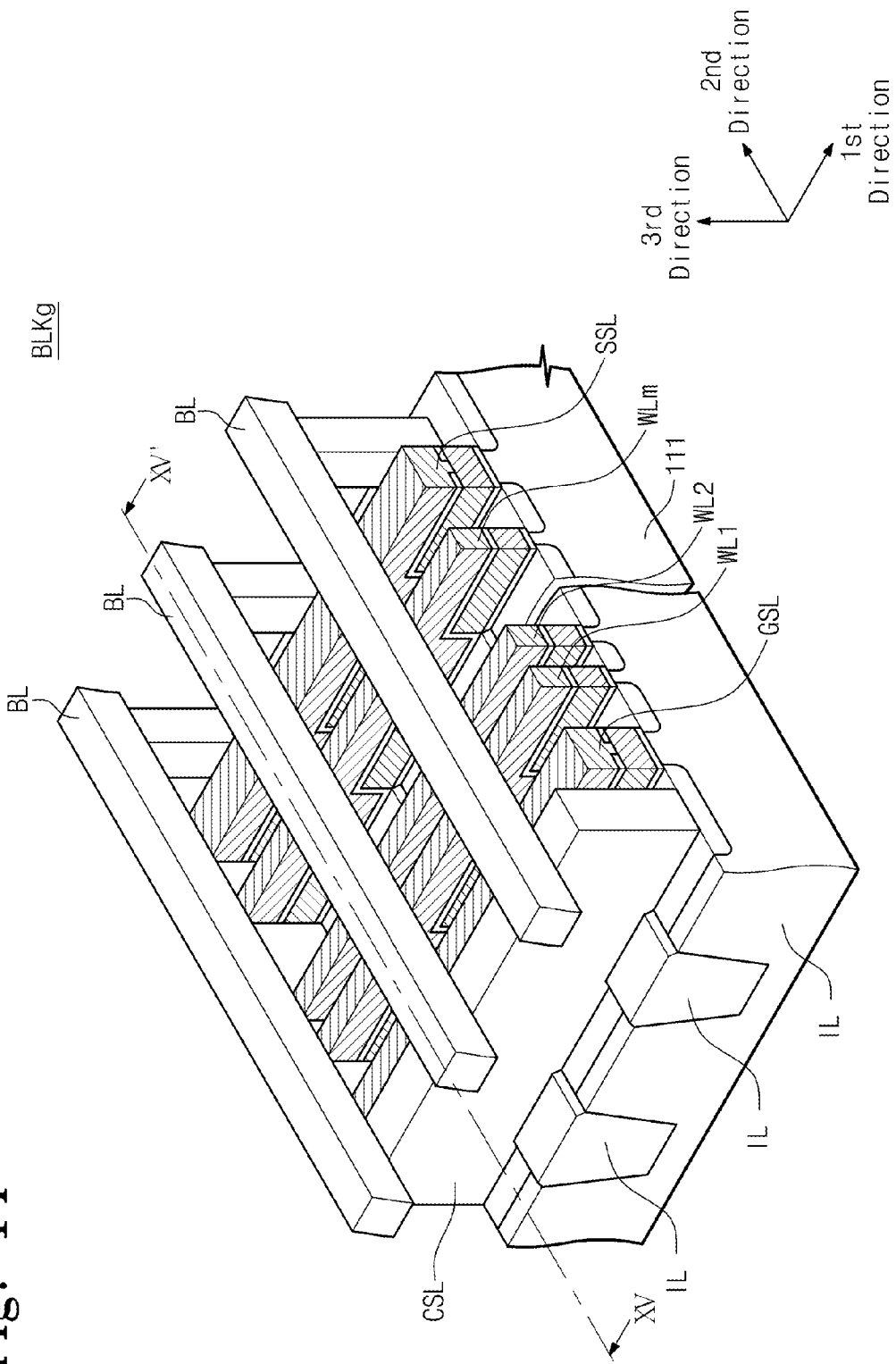
FIG. 14 is a perspective view of a part of a memory block in FIG. 2 according to another embodiment of the inventive concept.
Figure 15:
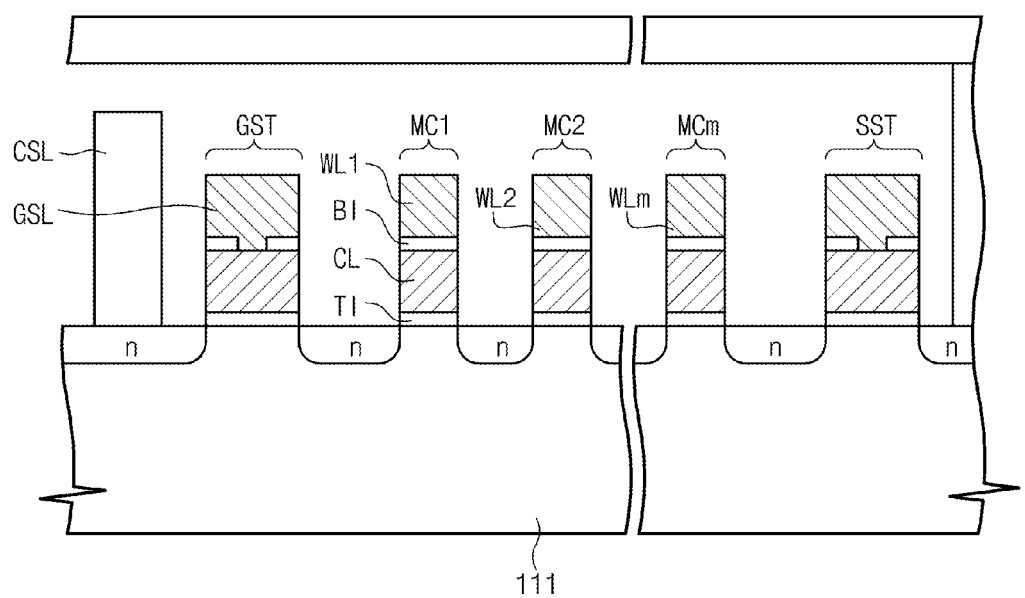
FIG. 15 is a cross-sectional view taken along a line XXXXI-XXXXI' in FIG. 14.

FIG. 14 is a perspective view of a portion of a memory block BLKg of FIG. 2 according to another embodiment of the inventive concept. FIG. 15 is a cross-sectional view taken along line XV-XV' in FIG. 14. A planar type NAND flash memory is exemplarily illustrated in FIGS. 14 and 15.

Referring to FIGS. 14 and 15, a device isolation film IL may be formed at a substrate 111 of a memory block BLKg to define active regions. There are illustrated three active regions extending along a second direction and spaced apart along a first direction. However, the number of active regions is not limited thereto.

A tunnel insulating film TI may be formed on each of the active regions. In the active regions, the tunnel insulating films TI may be spaced apart along the second direction. For example, each tunnel insulating film TI may include a thermal oxide film. For example, each tunnel insulating film TI may include an oxide film.

Charge storage films CL may be provided on the tunnel insulating films TI, respectively. For example, the charge storage films CL may include a conductive material such as poly silicon. For example, the charge storage films CL may include a nitride film or a metal oxide film (e.g., aluminum oxide film, hafnium oxide film, etc.).

When the charge storage films CL include a conductive material such as poly silicon, they may act as a floating gate. That is, the charge storage films CL may store data by accumulating charges. If the charge storage films CL include an insulating material, the charge storage films CL may act as a charge trap layer. That is, the charge storage films CL may store data by trapping charges.

The tunnel insulation films TI and the charge storage films CL may be provided on the active regions along the first direction. Blocking insulating films BI may be provided along the first direction on an axis provided along the first direction. Each blocking insulating film BI may include a nitride film. Each blocking insulating film BI may include a high dielectric film (e.g., aluminum oxide film, hafnium oxide film, etc.) having a dielectric constant larger than that of the tunnel insulating film TI.

Polysilicon films may be provided on the tunnel insulating films TI. The polysilicon films may be provided on the active regions to extend along the first direction. The polysilicon films may be spaced apart along the second direction.

In each active region, the tunnel insulating film TI, the charge storage film CL, the blocking insulating film BI, and the polysilicon film may form a gate structure. In embodiments, the tunnel insulating film TI, the charge storage film CL, the blocking insulating film BI, and the polysilicon film in each active region may form a memory cell MC. In certain embodiments, at a specific gate structure, a blocking insulating film BI may be punched to be connected with a polysilicon film and a charge storage film CL. Such a gate structure may form a selection transistor SST or GST.

In the event that a charge storage film CL includes an insulating material, a blocking insulating film BI of a gate structure of a selection transistor SST or GST may not be punched. That is, a charge storage film CL and a polysilicon film of a gate structure of a selection transistor SST or GST may be separated by a blocking insulating film BI.

In certain embodiments, a polysilicon film of a gate structure of a memory cell may be extended along the first direction to form a word line WL. Further, a polysilicon film of a gate structure of a selection transistor SST or GST may be extended along the first direction to form a selection line SSL or GSL.

N-type junction regions may be formed between gate structures. At this time, a source and a drain of a selection transistor SST or GST may be formed together. A conductive material extending along the first direction may be formed on a source of a ground selection transistor GST. The conductive material may form a common source line CSL. For example, the common source line CSL may include polysilicon. For example, the common source line CSL may include a metal material.

A bit line contact BP may be provided on a drain of a string selection transistor SST to be connected to a bit line BL. That is, a drain of the string selection transistor SST may be connected to a corresponding bit line BL via the bit line contact BP. Bit lines may be provided on the same axis as active regions. Three bit lines are exemplarily illustrated.

Figure 16:
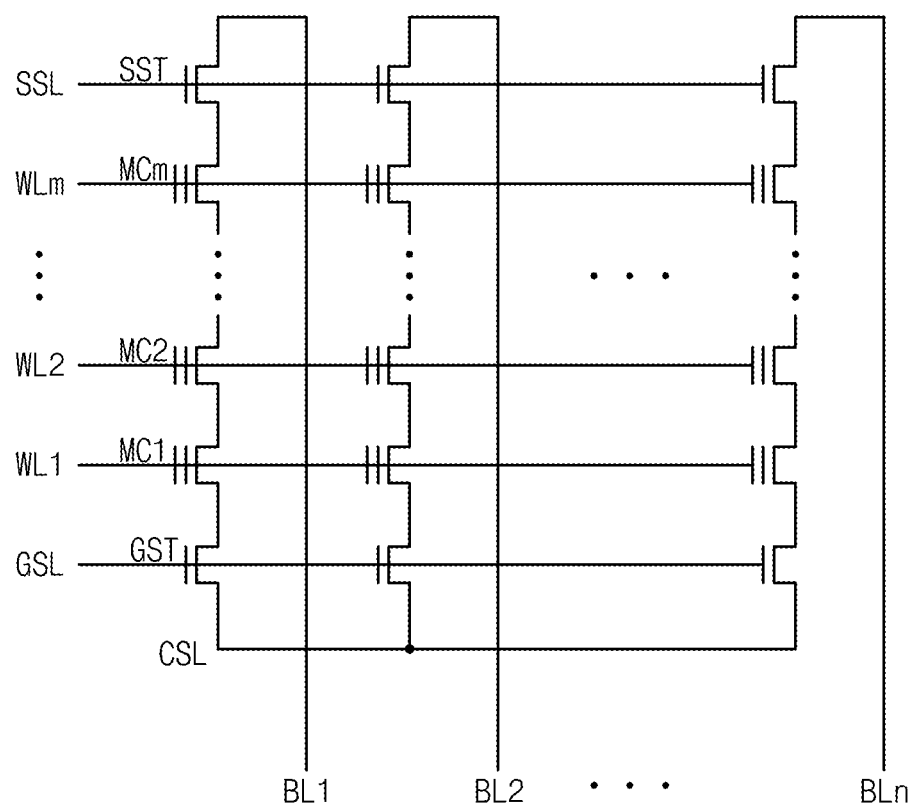
FIG. 16 is an equivalent circuit diagram of a memory block described in FIGS. 14 and 15.

FIG. 16 is an equivalent circuit diagram for the memory block described of FIGS. 14 and 15. Referring to FIGS. 14 to 16, memory cells MC1 to MCm provided along a row direction may be connected to word lines WL1 to WLm. Memory cells MC in the same row may be connected to the same word line WL.

Memory cells MC 1 to MCm provided along a column direction may correspond to bit lines BL1 to BLn. Memory cells MC1 to MCm in the same column may correspond to the same bit line BL.

String selection transistors SST may be provided between memory cells MC1 to MCm and bit lines BL1 to BLn, respectively. The string selection transistors SST may be connected in common to a string selection line SSL.

Ground selection transistors GST may be provided between memory cells MC1 to MCm and a common source line CSL, respectively. The ground selection transistors GST may be connected in common to a ground selection line GSL.

A planar type flash memory described with reference to FIGS. 14 and 15 may be configured to perform an information read operation according to an embodiment of the inventive concept. That is, the information read operation may be performed by supplying a turn-on voltage to a string selection line of a memory block and selecting at least two word lines of a corresponding memory block. The same information may be stored at memory cells connected to the selected at least two word lines.

The information read operation may be performed by supplying a turn-on voltage to at least two string selection lines of at least two memory cells and selecting at least two word lines. The same information may be stored at memory cells connected to the selected at least two word lines.

Figure 17:
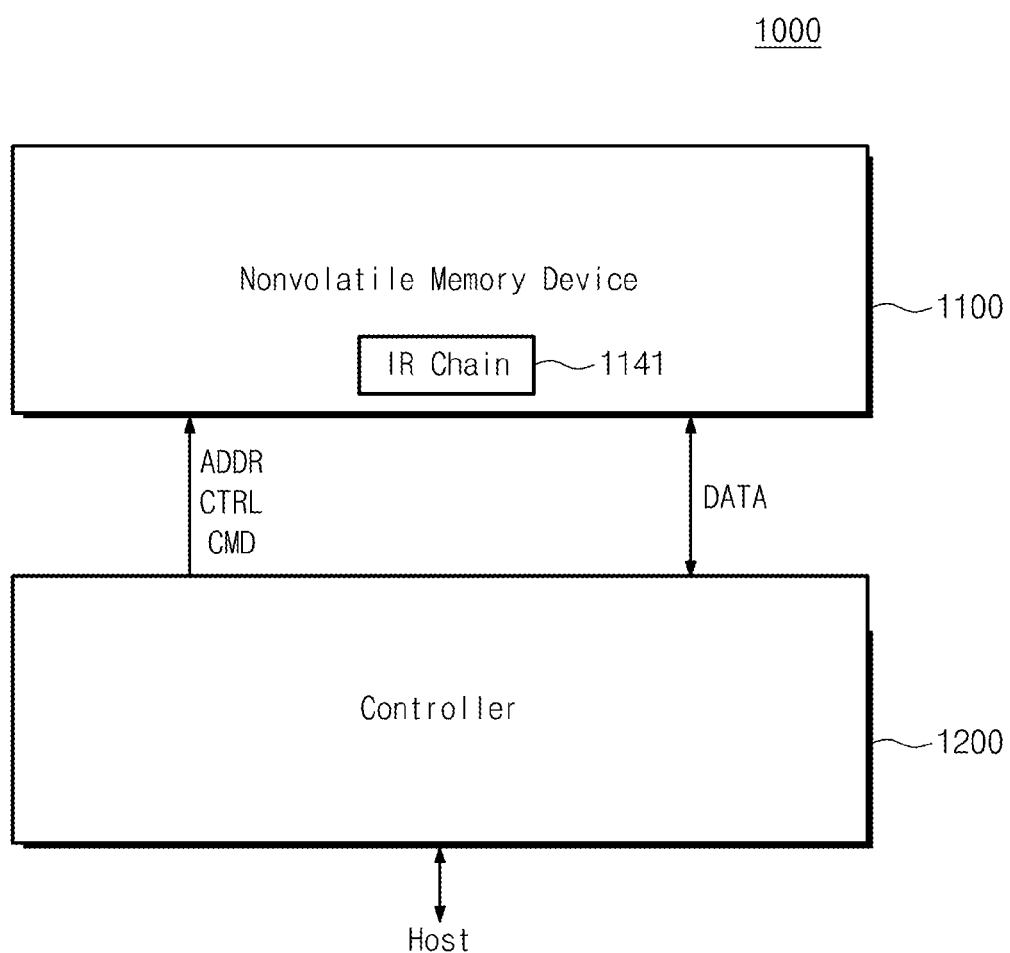
FIG. 17 is a block diagram illustrating a memory system according to an embodiment of the inventive concept.

FIG. 17 is a block diagram illustrating a memory system according to an embodiment of the inventive concept. Referring to FIG. 17, a memory system 1000 may include a nonvolatile memory device 1100 and a controller 1200.

The nonvolatile memory device 1100 may be substantially the same as that in FIG. 1. That is, the nonvolatile memory device 1100 may perform an information read operation under the control of an information read chain 1141. At the information read operation, at least two word lines may be selected, and memory cells connected to the selected at least two word lines may be read simultaneously. In embodiments, when a power is supplied to the nonvolatile memory device 1100, the nonvolatile memory device 1100 may automatically perform the information read operation.

The controller 1200 may be connected with a host and the nonvolatile memory device 1100. In response to a request from the host, the controller 1200 may be configured to access the nonvolatile memory device 1100. For example, the controller 1200 may be configured to control a read operation, a program operation, an erase operation, and certain background operation(s) for the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 may be configured to provide the nonvolatile memory device 1100 with a control signal CTRL, a command CMD, and an address ADDR. The controller 1200 may be configured to exchange data with the nonvolatile memory device 1100.

The controller 1200 may further include constituent elements such as a RAM, a processing unit, a host interface, and a memory interface. The RAM may be used as at least one of a working memory of the processing unit, a cache memory between the nonvolatile memory device 1100 and the host, and a buffer memory between the nonvolatile memory device 1100 and the host. The processing unit may control an overall operation of the controller 1200.

The host interface may include the protocol for executing data exchange between the host and the controller 1200. Exemplarily, the host interface may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, an IDE (Integrated Drive Electronics) protocol, and a Firewire. The memory interface may interface with the nonvolatile memory device 1100. The memory interface may include a NAND interface or a NOR interface.

The memory system 1000 may be configured to further include an error detecting and correcting block. The error detecting and correcting block may be configured to detect and correct an error of data read from the nonvolatile memory device 1100 using ECC data (or, parity data). In embodiments, the error detecting and correcting block may be provided as a constituent element of the controller 1200. In other embodiments, the error detecting and correcting block may be provided as a constituent element of the nonvolatile memory device 1100.

The controller 1200 and the nonvolatile memory device 1100 may be integrated to one semiconductor device. The controller 1200 and the nonvolatile memory device 1100 may be integrated to one semiconductor device to form a memory card. For example, the controller 1200 and the nonvolatile memory device 1100 may be integrated to one semiconductor device to form a memory card such as a PC (or, PCMCIA) card, a Compact Flash (CF) card, a SmartMedia (SM) card, a memory stick, a multimedia card (MMC, RS-MMC, MMC-micro), an SD card (SD, miniSD, SDHC), a Universal Flash Storage (UFS) device, or the like.

The controller 1200 and the nonvolatile memory device 1100 may be integrated to one semiconductor device to form a Solid State Drive (SSD). The SSD may include a storage device which is configured to store data using semiconductor memories. In case that the memory system 1000 is used as the SSD, an operating speed of a host connected with the memory system 1000 may be remarkably improved.

The memory system 1000 may be used, for example in a computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

The nonvolatile memory device 1100 or memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 18:
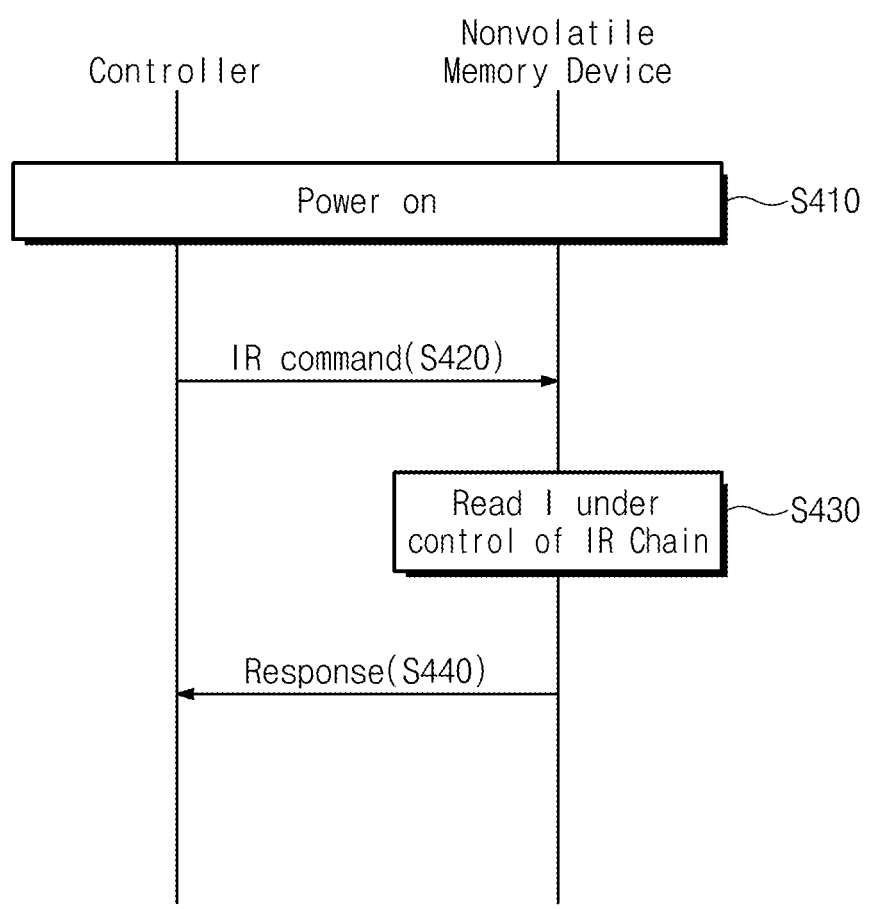
FIG. 18 is a flowchart describing an operating method of a memory system according to an embodiment of the inventive concept.

FIG. 18 is a diagram further describing possible operation of a memory system according to an embodiment of the inventive concept. Referring to FIGS. 17 and 18, the controller 1200 may control nonvolatile memory device 1100 to perform an information read operation.

First, power is supplied to the nonvolatile memory device 1100 and controller 1200 (S410). Then, the controller 1200 generates an information read command to send it to the nonvolatile memory device 1100 (S420). For example, in response to an input of a power, the controller 1200 may generate an information read command to send it to the nonvolatile memory device 1100. The controller 1200 may generate and send the information read command according to a predetermined schedule.

In response, the nonvolatile memory device 1100 reads memory device information (e.g., including initial setting values and/or metadata) under the control of an information read chain 141 (S430), and returns a response to the controller 1200 (S440). When the information includes initial setting values (S440), the nonvolatile memory device 1100 may send a message indicating that the information read operation is ended.

When the information includes metadata, the nonvolatile memory device 1100 may send the metadata read via the information read operation.

Figure 19:
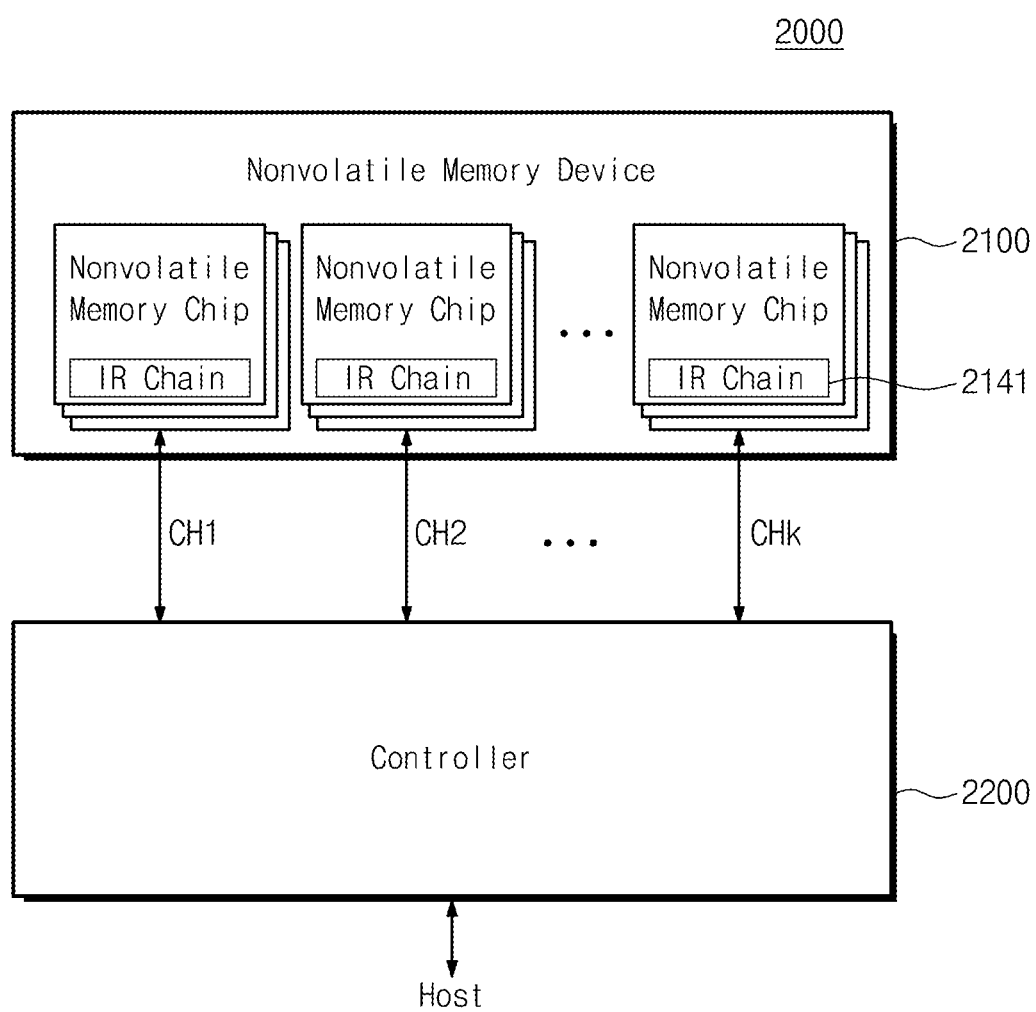
FIG. 19 is a block diagram illustrating an application of a memory system in FIG. 17.

FIG. 19 is a block diagram illustrating an application of a memory system in FIG. 17. Referring to FIG. 19, a memory system 2000 may include a nonvolatile memory device 2100 and a controller 2200. The nonvolatile memory device 2100 may include a plurality of nonvolatile memory chips, which form a plurality of groups. Nonvolatile memory chips in each group may be configured to communicate with the controller 2200 via one common channel. In an embodiment, the plurality of nonvolatile memory chips may communicate with the controller 2200 via a plurality of channels CH1 to CHk.

Each nonvolatile memory chip may be substantially the same as that in FIG. 1. That is, each nonvolatile memory chip may perform an information read operation under the control of an information read chain 2141. At the information read operation, at least two word lines may be selected, and memory cells connected to the selected at least two word lines may be read simultaneously.

In FIG. 19, there is described the case that one channel is connected with a plurality of nonvolatile memory chips. However, the memory system 2000 can be modified such that one channel is connected with one nonvolatile memory chip.

Figure 20:
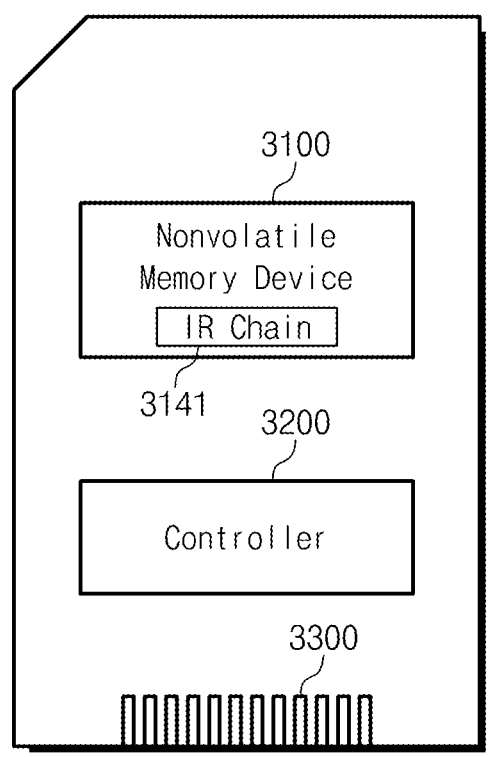
FIG. 20 is a diagram illustrating a memory card according to an embodiment of the inventive concept.

FIG. 20 is a diagram illustrating a memory card according to an embodiment of the inventive concept. Referring to FIG. 20, a memory card 3000 may include a nonvolatile memory device 3100, a controller 3200, and a connector 3300.

The nonvolatile memory device 3100 may be substantially the same as that in FIG. 1. That is, each nonvolatile memory chip may perform an information read operation under the control of an information read chain 3141. At the information read operation, at least two word lines may be selected, and memory cells connected to the selected at least two word lines may be read simultaneously.

The connector 3300 may connect the memory card 3000 with a host electrically.

The memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 21:
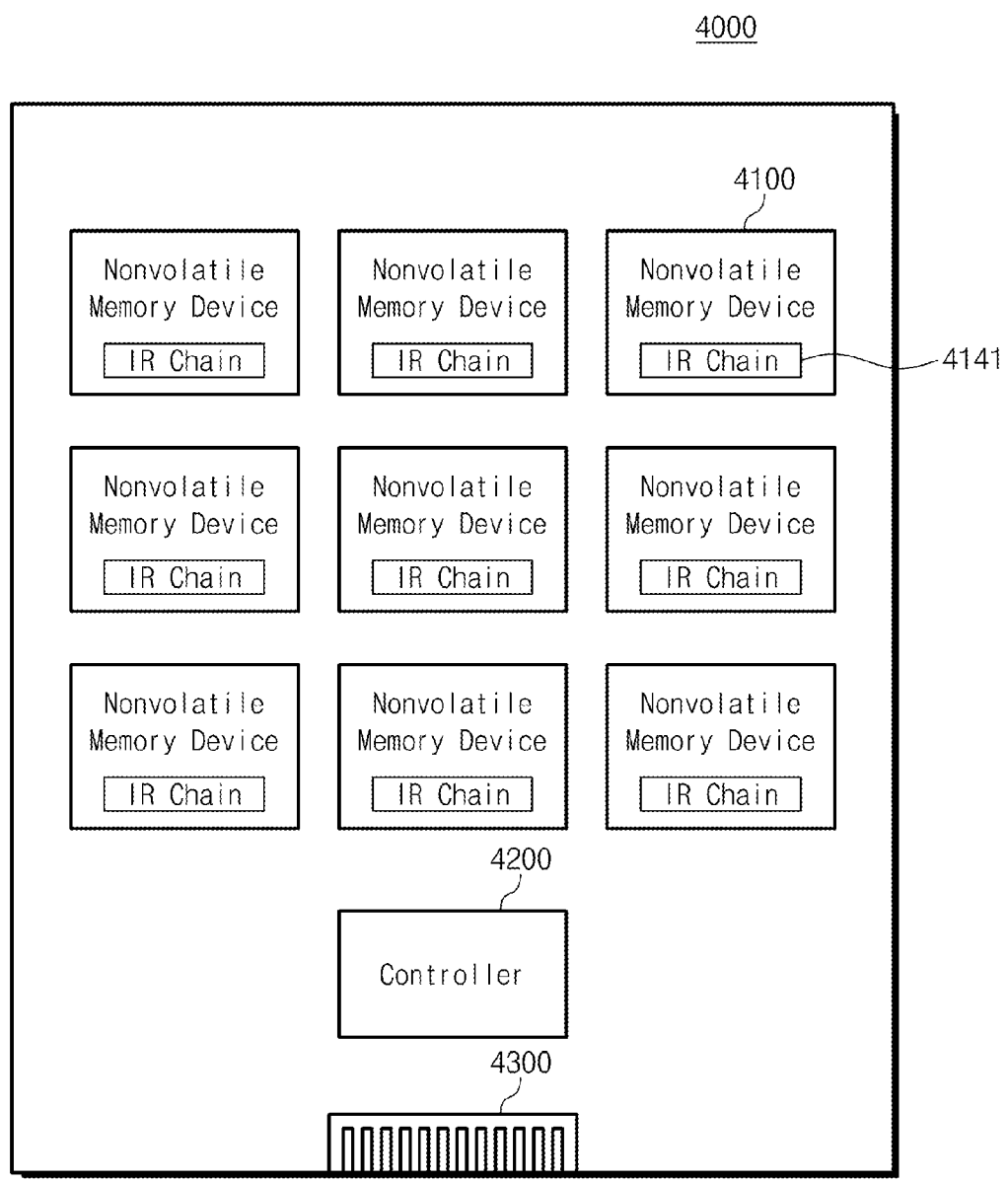
FIG. 21 is a diagram illustrating a solid state drive according to an embodiment of the inventive concept.

FIG. 21 is a diagram illustrating a solid state drive according to an embodiment of the inventive concept. Referring to FIG. 21, a solid state drive 4000 may include a plurality of nonvolatile memory devices 4100, a controller 4200, and a connector 4300.

Each of the nonvolatile memory devices 4100 may be substantially the same as that in FIG. 1. That is, each of the nonvolatile memory devices 4100 may perform an information read operation under the control of an information read chain 4141. At the information read operation, at least two word lines may be selected, and memory cells connected to the selected at least two word lines may be read simultaneously.

The connector 4300 may connect the solid state driver 4000 with a host electrically.

Figure 22:
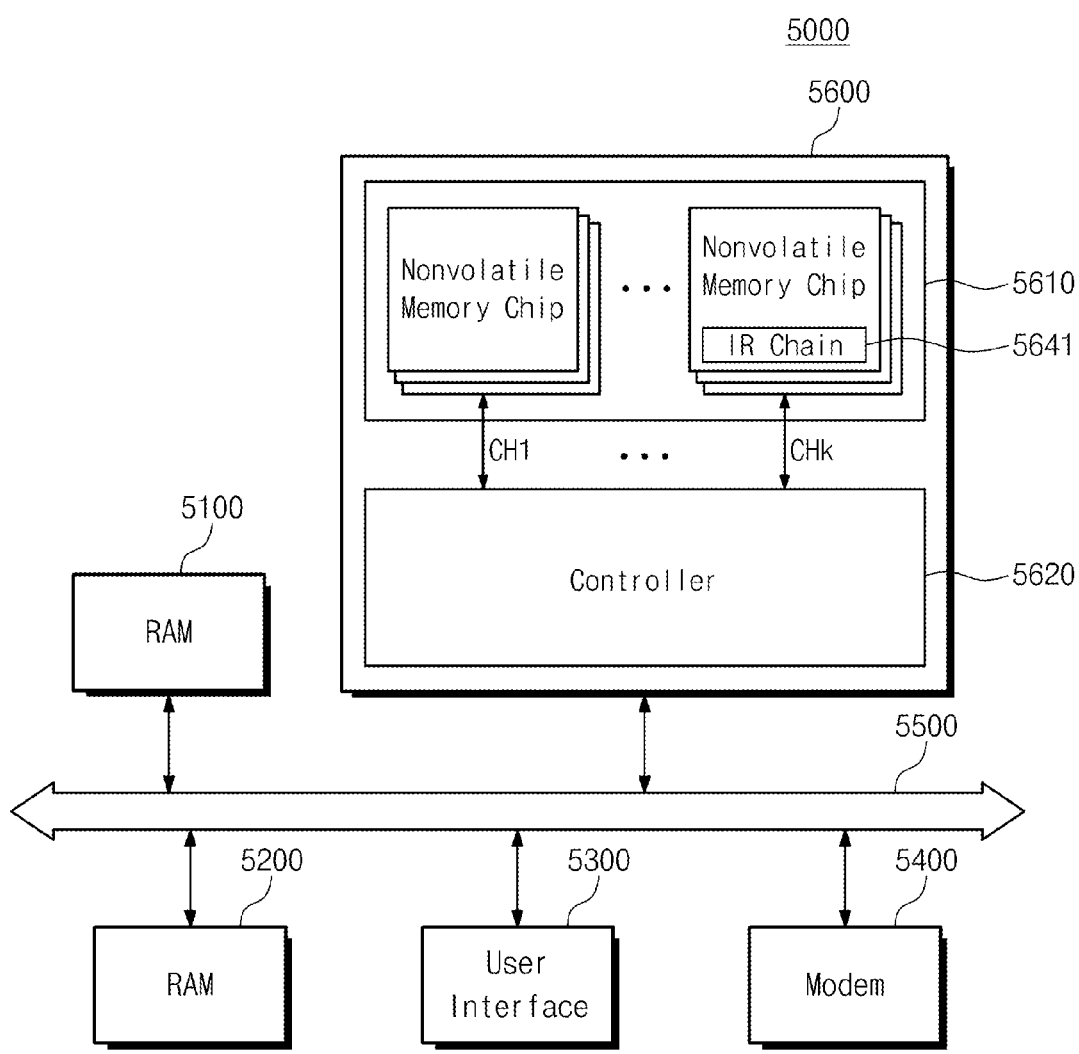
FIG. 22 is a block diagram illustrating a computing system according to an embodiment of the inventive concept.

FIG. 22 is a block diagram illustrating a computing system according to an embodiment of the inventive concept. Referring to FIG. 22, a computing system 5000 may include a central processing unit 5100, a RAM 5200, a user interface 5300, a modem 5400, a system bus 5500, and a memory system 5600.

The memory system 5600 may be connected electrically with the elements 5100 to 5400 via the system bus 5500. Data provided via the user interface 5300 or processed by the central processing unit 5100 may be stored in the memory system 5600.

The memory system 5600 may include a nonvolatile memory device 5610 and a controller 5620. The nonvolatile memory device 5610 may include a plurality of nonvolatile memory chips. Each of the nonvolatile memory chips may include an information read chain 5641. The memory system 5600 may be a memory system 1000 or 2000 described with reference to FIG. 17 or 19.

In FIG. 22, there is illustrated the case that a nonvolatile memory device 5610 is connected to the system bus 5500 via a controller 5620. However, the nonvolatile memory device 56100 can be electrically connected directly to the system bus 5500.

While the inventive concept has been described with reference to exemplary embodiments, it will be apparent to those skilled in the art that various changes and modifications may be made without departing from the scope of the following claims. Therefore, it should be understood that the above embodiments are not limiting, but illustrative.

What is claimed is:

1. A method reading memory device information from a nonvolatile memory device having a three-dimensional (3D) memory cell array including an original plane storing data associated with the information in a first group of memory cells and a replica plane storing the data in replica in a second group of memory cells, the method comprising:
    applying a selection read voltage to a selected word line connected to the first and second groups of memory cells while applying a non-selection read voltage to other word lines; and
    simultaneously reading first data from the first group of memory cells and second data from the second group of memory cells.

2. The read method of claim 1, further comprising:
    applying a bias voltage to a bit line connected to at least one memory cell in the first and second groups of memory cells,
    wherein the first data from the first group of memory cells and the second data from the second group of memory cells are read according to variation in the bit line voltage.

3. The read method of claim 2, wherein each of the first and second groups of memory cells includes a plurality of cell strings respectively including two or more memory cells, each cell string being connected to a bit line via a string selection transistor connected to a string selection line,
    the method further comprising applying a turn-on voltage to at least two string selection lines corresponding to two memory cells respectively disposed in the first and second group of memory cells.

4. A nonvolatile memory device comprising:
    a three-dimensional (3D) memory cell array including an original plane storing data associated with memory device information in a first group of memory cells and a replica plane storing the data in replica in a second group of memory cells;
    an address decoder connected to the plurality of memory cells via a plurality of word lines;
    a read/write circuit connected to the plurality of memory cells via a plurality of bit lines; and
    control logic configured to control the address decoder and the read/write circuit,
    wherein during a read operation of the information, the address decoder is configured to simultaneously select at least two word lines of the original plane and the replica plane, respectively, and the read/write circuit is configured to simultaneously read memory cells connected to the selected at least two word lines.

5. The nonvolatile memory device of claim 4, wherein each of the plurality of memory cells is included in a cell string having two or more memory cells, each cell string being connected to a bit line via a string selection transistor connected to a string selection line.

6. The nonvolatile memory device of claim 5, wherein during the information read operation, the address decoder is further configured to respectively apply a turn-on voltage to at least two string selection lines corresponding to the selected at least two word lines.

7. The nonvolatile memory device of claim 5, wherein memory cells in each cell string are stacked on a substrate in a direction perpendicular to the substrate.

8. The nonvolatile memory device of claim 7, wherein two or more cell strings form a memory block, and
    word lines connected to memory cells at a same height from the substrate from among memory cells of cell strings of the memory block are commonly connected to a word line.

9. The nonvolatile memory device of claim 8, wherein the selected at least two word lines are connected to memory cells at the same height from the substrate; and
    during the information read operation, the address decoder is further configured to apply a selection read voltage to the selected at least two word lines via the common word line.

10. The nonvolatile memory device of claim 4, wherein memory cells connected to the at least two word lines store the same data.

11. The nonvolatile memory device of claim 10, wherein the same data includes information indicating an initial setting value for the nonvolatile memory device.

12. The nonvolatile memory device of claim 10, wherein the same data includes a pattern formed by a plurality of bits, and
    the control logic is further configured to judge a symbol in relation to the pattern.

13. The nonvolatile memory device of claim 4, wherein the information read operation is performed when power is supplied to the nonvolatile memory device.

14. The nonvolatile memory device of claim 4, wherein during the information read operation, memory cells connected to the selected at least two word lines are read a number of times.

15. The nonvolatile memory device of claim 14, wherein the control logic judges a final read result according to a result of a read operation performed the number of times.

16. The nonvolatile memory device of claim 4, wherein a result of the information read operation is stored in a register of the control logic.

17. A control method for a system including a controller and a nonvolatile memory (NVM), the NVM including a three-dimensional (3D) memory cell array, and the method comprising:
    storing memory device information data in a first group of memory cells in an original plane of the 3D memory cell array;
    storing a replica of the memory device information data in a second group of memory cells in a replica plane of the 3D memory cell array, different from the original plane; and
    configuring the controller to execute a memory device information read operation during which the first and second groups of memory cells are simultaneously read from the 3D memory cell array.

18. The control method of claim 17, wherein the memory device information data is initial setting value data and the controller executes the memory device information read operation upon power-up of the system.

19. The control method of claim 17, wherein the 3D memory cell array is divided into a plurality of memory blocks, and the original plane is disposed in a first block among the plurality of memory blocks, and the replica plane is disposed in a second block among the plurality of memory blocks, the first and second being physically non-adjacent to each other among the plurality of memory blocks.

20. The control method of claim 17, wherein the memory cells of the 3D memory cell array are NAND flash memory cells.

* * * * *